US008425286B2

(12) United States Patent
Coster et al.

(10) Patent No.: US 8,425,286 B2
(45) Date of Patent: Apr. 23, 2013

(54) QUICK RELEASE STRUCTURES FOR A COMPUTER

(75) Inventors: Daniel J. Coster, San Francisco, CA (US); Daniele De Iuliis, San Francisco, CA (US); Chiew-Siang Goh, Cupertino, CA (US); Douglas L. Heirich, Palo Alto, CA (US); Steven Holmes, Mountain View, CA (US); Jonathan Ive, San Francisco, CA (US); Sung Kim, Palo Alto, CA (US); Rick Mariano, Hayward, CA (US); Thomas J. Misage, San Francisco, CA (US); Dan Riccio, Los Gatos, CA (US); Tang Yew Tan, San Francisco, CA (US); Jeremy Yaekel, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 809 days.

(21) Appl. No.: 11/747,825

(22) Filed: May 11, 2007

(65) Prior Publication Data
US 2007/0242426 A1 Oct. 18, 2007

Related U.S. Application Data

(62) Division of application No. 10/791,997, filed on Mar. 2, 2004, now Pat. No. 7,242, 576.

(60) Provisional application No. 60/535,279, filed on Jan. 8, 2004.

(51) Int. Cl.
*H05K 5/00* (2006.01)
*H05K 7/20* (2006.01)

(52) U.S. Cl.
USPC .......................................... 454/184; 361/695

(58) Field of Classification Search .................. 454/184, 454/195; 361/695, 690; 439/364
See application file for complete search history.

(56) References Cited

U.S. PATENT DOCUMENTS 4,412,478 A * 11/1983 Osher et al. ................... 454/195
4,501,460 A    2/1985 Sisler
(Continued)

FOREIGN PATENT DOCUMENTS
JP          10284863 A  * 10/1998

OTHER PUBLICATIONS

Press Release, "Apple Ships New Power Mac G5," Aug. 18, 2003, Cupertino, CA.

(Continued)

*Primary Examiner* — Steven B McAllister
*Assistant Examiner* — Helena Kosanovic
(74) *Attorney, Agent, or Firm* — Womble Carlyle Sandridge & Rice LLP

(57) ABSTRACT

Quick release couplings for releasably coupling components of a computer to the computer are disclosed. The quick release coupling mechanisms are generally configured to allow tool-less placement of the components relative to the computer. That is, the quick release coupling mechanisms are configured to perform their couplings without using conventional fasteners such as screws, bolts, etc. By eliminating the use of fasteners, the components may be inserted and removed from the computer without using tools (e.g., tool-less). Furthermore, the quick release couplings are easy to maneuver thereby enabling quick and straightforward assembly and disassembly of the components to and from the computer (e.g., quick release). For example, the components may be inserted and removed by a simple pushing or pulling motion, and/or by a simple flick of a latch or handle.

23 Claims, 22 Drawing Sheets

U.S. PATENT DOCUMENTS

| | | | |
|---|---|---|---|
| 5,216,246 A | | 6/1993 | Weldman et al. |
| 5,375,038 A | | 12/1994 | Hardt |
| 5,412,534 A | | 5/1995 | Cutts et al. |
| 5,452,181 A | | 9/1995 | Hoover |
| 5,562,410 A | * | 10/1996 | Sachs et al. ............... 415/213.1 |
| 5,781,408 A | | 7/1998 | Crane et al. |
| 5,788,467 A | * | 8/1998 | Zenitani et al. ............... 417/360 |
| 5,808,867 A | * | 9/1998 | Wang ........................... 361/695 |
| 5,822,186 A | | 10/1998 | Bull et al. |
| 5,860,015 A | | 1/1999 | Olson |
| 5,867,095 A | | 2/1999 | Klein et al. |
| 5,918,188 A | | 6/1999 | Doran |
| 5,963,424 A | | 10/1999 | Hileman et al. |
| 6,006,168 A | | 12/1999 | Schumann et al. |
| 6,018,456 A | | 1/2000 | Young et al. |
| 6,027,360 A | * | 2/2000 | Jenkins ......................... 439/364 |
| 6,029,119 A | | 2/2000 | Atkinson |
| 6,031,717 A | * | 2/2000 | Baddour et al. ......... 361/679.49 |
| 6,031,719 A | | 2/2000 | Schmitt et al. |
| 6,049,973 A | | 4/2000 | Frank, Jr. et al. |
| 6,053,586 A | | 4/2000 | Cook et al. |
| 6,058,009 A | | 5/2000 | Hood, III et al. |
| 6,062,663 A | | 5/2000 | You et al. |
| 6,072,397 A | | 6/2000 | Ostrowski |
| 6,109,710 A | | 8/2000 | Wu et al. |
| 6,132,019 A | | 10/2000 | Kim et al. |
| 6,134,667 A | | 10/2000 | Suzuki et al. |
| 6,157,532 A | | 12/2000 | Cook et al. |
| 6,200,215 B1 | | 3/2001 | Larsson et al. |
| 6,212,069 B1 | | 4/2001 | Janik et al. |
| 6,219,226 B1 | | 4/2001 | Bullington et al. |
| 6,257,682 B1 | | 7/2001 | Liu et al. |
| 6,259,352 B1 | | 7/2001 | Yulkowski et al. |
| 6,288,897 B1 | | 9/2001 | Fritschle et al. |
| 6,336,080 B1 | | 1/2002 | Atkinson |
| 6,356,435 B1 | | 3/2002 | Davis et al. |
| 6,359,214 B1 | | 3/2002 | Worley et al. |
| 6,362,958 B1 | | 3/2002 | Yu et al. |
| 6,366,832 B2 | | 4/2002 | Lomonaco et al. |
| 6,373,698 B1 | * | 4/2002 | Christensen ................... 361/695 |
| 6,400,045 B1 | | 6/2002 | Hosokawa et al. |
| 6,407,910 B1 | | 6/2002 | Diaz et al. |
| 6,414,828 B1 | | 7/2002 | Zimmerman et al. |
| 6,414,845 B2 | * | 7/2002 | Bonet ........................... 361/695 |
| 6,430,041 B1 | | 8/2002 | Johnson et al. |
| 6,434,001 B1 | | 8/2002 | Bhatia |
| 6,459,574 B1 | | 10/2002 | Ghosh |
| 6,462,940 B1 | | 10/2002 | Diaz et al. |
| 6,472,779 B2 | | 10/2002 | Hwang et al. |
| 6,473,297 B1 | | 10/2002 | Behl et al. |
| 6,504,718 B2 | | 1/2003 | Wu |
| 6,522,535 B1 | | 2/2003 | Helot et al. |
| 6,532,151 B2 | | 3/2003 | Osecky et al. |
| 6,542,384 B1 | | 4/2003 | Radu et al. |
| 6,545,438 B1 | | 4/2003 | Mays, II |
| 6,556,437 B1 | | 4/2003 | Hardin |
| 6,574,102 B2 | | 6/2003 | Usui et al. |
| 6,587,342 B1 | | 7/2003 | Hsu |
| 6,592,327 B2 | * | 7/2003 | Chen et al. ............... 415/213.1 |
| 6,595,605 B1 | | 7/2003 | Babcock et al. |
| 6,618,245 B2 | | 9/2003 | Diaz |
| 6,628,512 B2 | | 9/2003 | Searby et al. |
| 6,654,894 B2 | | 11/2003 | Kaminski et al. |
| 6,665,163 B2 | | 12/2003 | Yanagisawa |
| 6,678,157 B1 | | 1/2004 | Bestwick |
| 6,721,180 B2 | | 4/2004 | Le et al. |
| 6,722,971 B2 | * | 4/2004 | Gough ........................... 454/187 |
| 6,775,144 B2 | | 8/2004 | Gan et al. |
| 6,795,314 B1 | | 9/2004 | Arbogast et al. |
| 6,816,391 B2 | | 11/2004 | Davis et al. |
| 6,822,863 B1 | | 11/2004 | Artman et al. |
| 6,824,174 B2 | | 11/2004 | Lin et al. |
| 6,865,078 B1 | * | 3/2005 | Chang ........................... 361/695 |
| 6,932,447 B2 | | 8/2005 | Chen et al. |
| 6,935,130 B2 | | 8/2005 | Cheng et al. |
| 7,035,102 B2 | | 4/2006 | Holmes et al. |
| 7,061,761 B2 | | 6/2006 | Tucker et al. |
| 7,068,505 B2 | * | 6/2006 | Kosugi ........................... 361/690 |
| 7,167,993 B1 | | 1/2007 | Thomas et al. |
| 7,242,576 B2 | | 7/2007 | Coster et al. |
| 7,248,476 B2 | | 7/2007 | Holmes et al. |
| 2002/0069760 A1 | * | 6/2002 | Pruette et al. ..................... 96/70 |
| 2002/0094283 A1 | * | 7/2002 | Salmen et al. ............... 417/360 |
| 2002/0142646 A1 | * | 10/2002 | Huang et al. ................... 439/485 |
| 2003/0000898 A1 | * | 1/2003 | Elliott ........................ 211/41.17 |
| 2003/0017747 A1 | * | 1/2003 | Blanchfield et al. .......... 439/677 |
| 2003/0076652 A1 | | 4/2003 | Ahn |
| 2003/0112601 A1 | * | 6/2003 | Smith et al. ..................... 361/695 |
| 2003/0123222 A1 | * | 7/2003 | Thompson et al. ........... 361/687 |
| 2004/0022024 A1 | | 2/2004 | Le et al. |
| 2004/0080910 A1 | * | 4/2004 | Chen ............................. 361/695 |
| 2004/0085719 A1 | | 5/2004 | Huang |
| 2004/0190246 A1 | * | 9/2004 | Arbogast et al. .............. 361/695 |
| 2004/0196623 A1 | | 10/2004 | Erickson et al. |
| 2007/0201205 A1 | | 8/2007 | Holmes et al. |

OTHER PUBLICATIONS

Office Action dated Apr. 9, 2008 from U.S. Appl. No. 11/742,485.
Office Action dated Sep. 26, 2007 from U.S. Appl. No. 11/742,485.
Notice of Allowance dated Aug. 18, 2008 in U.S. Appl. No. 11/742,485.
Notice of Allowance dated Nov. 19, 2009 in U.S. Appl. No. 12/277,879.
Notice of Allowance dated Sep. 14, 2010 in U.S. Appl. No. 12/699,756.

* cited by examiner

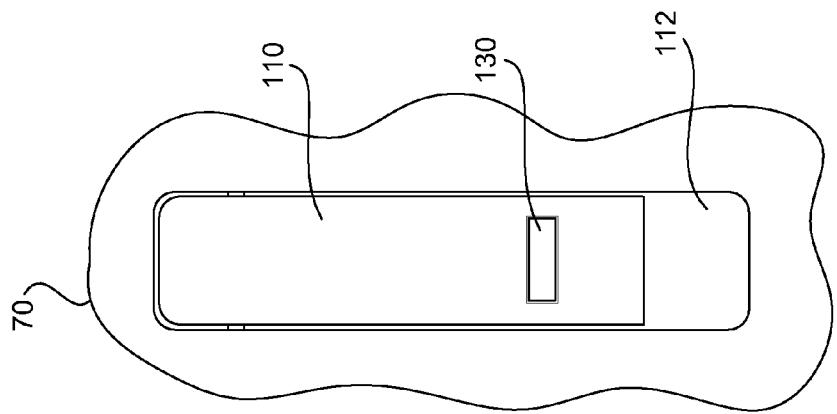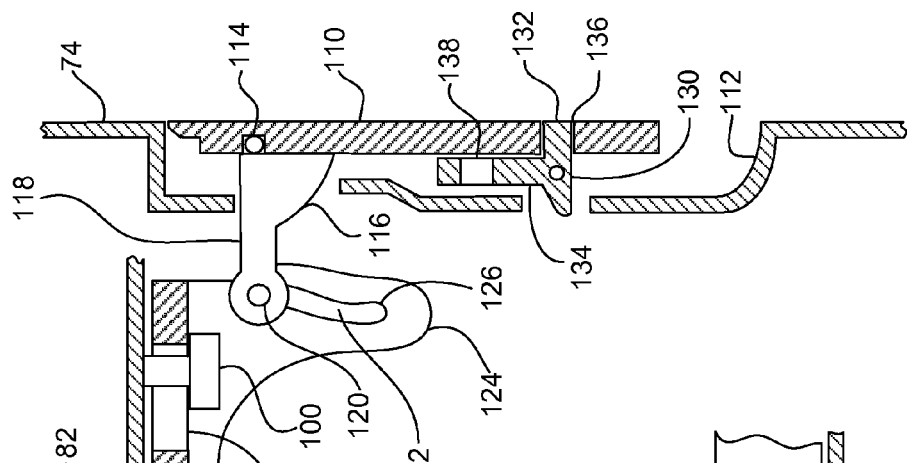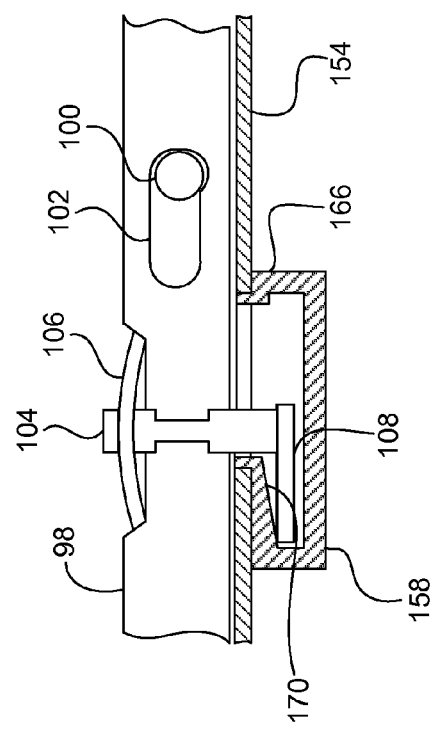
FIG. 6C
FIG. 6A
FIG. 6B

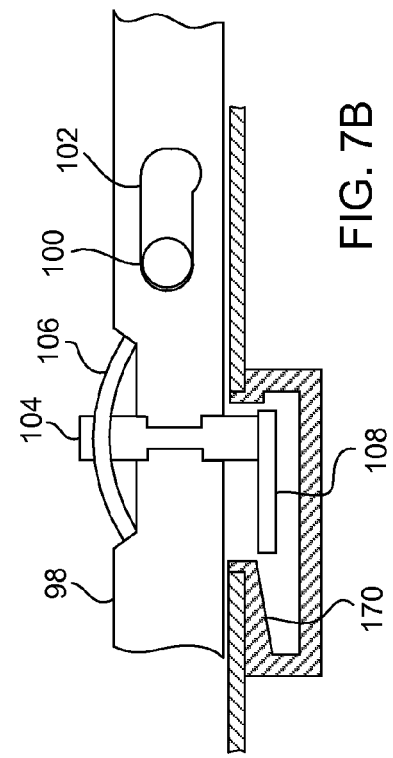
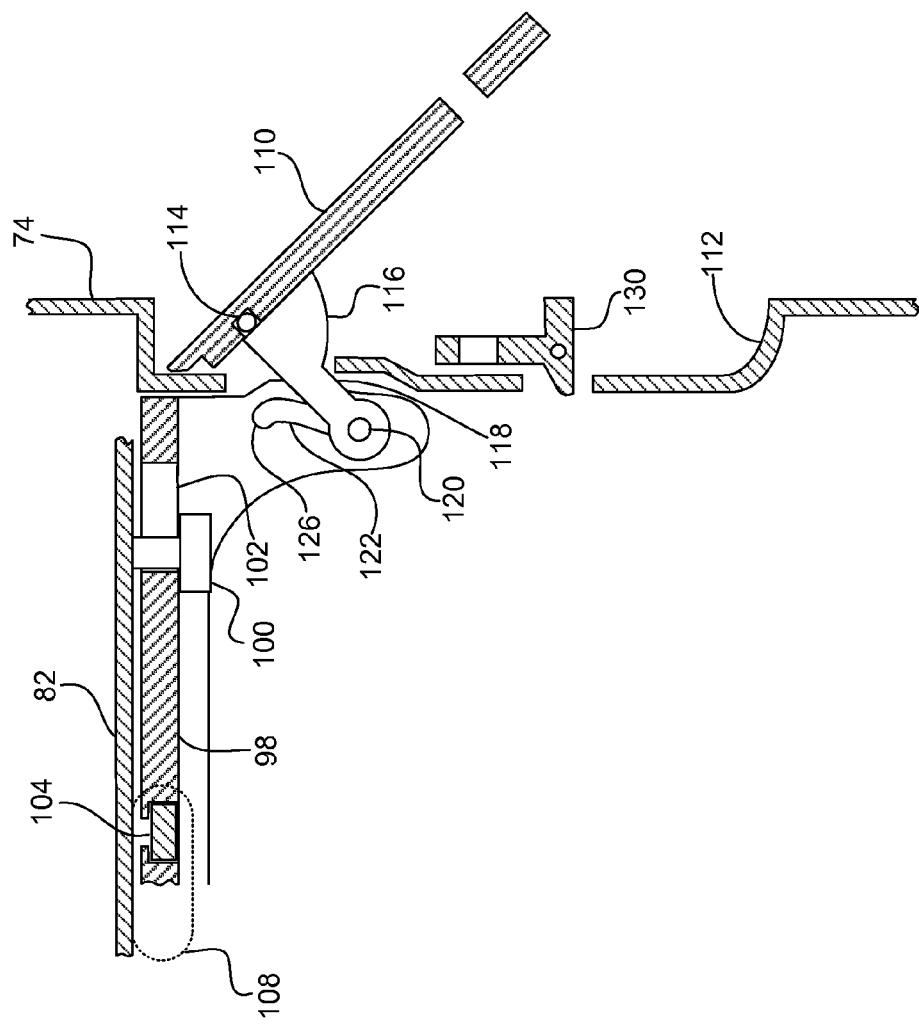
FIG. 7B
FIG. 7A

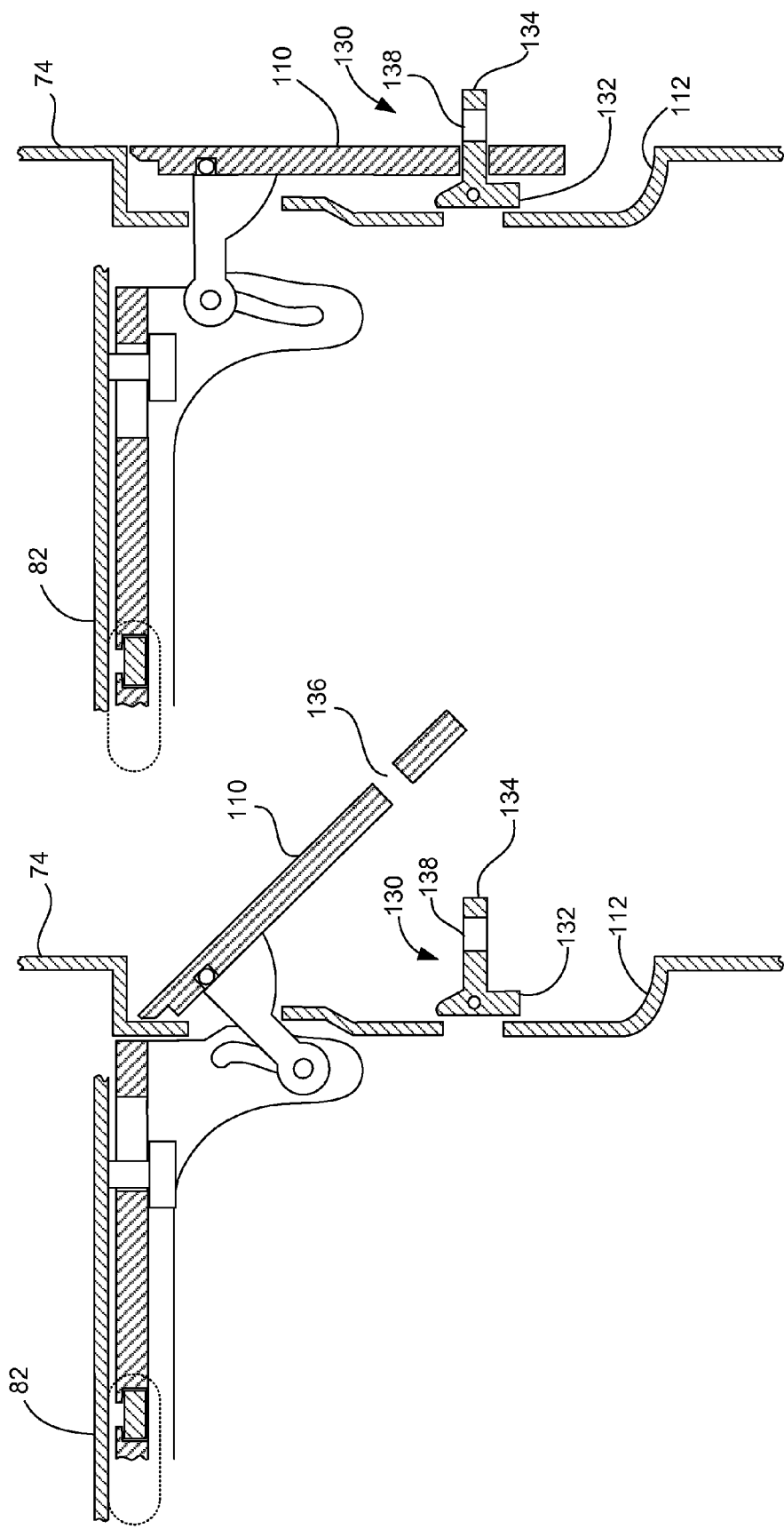

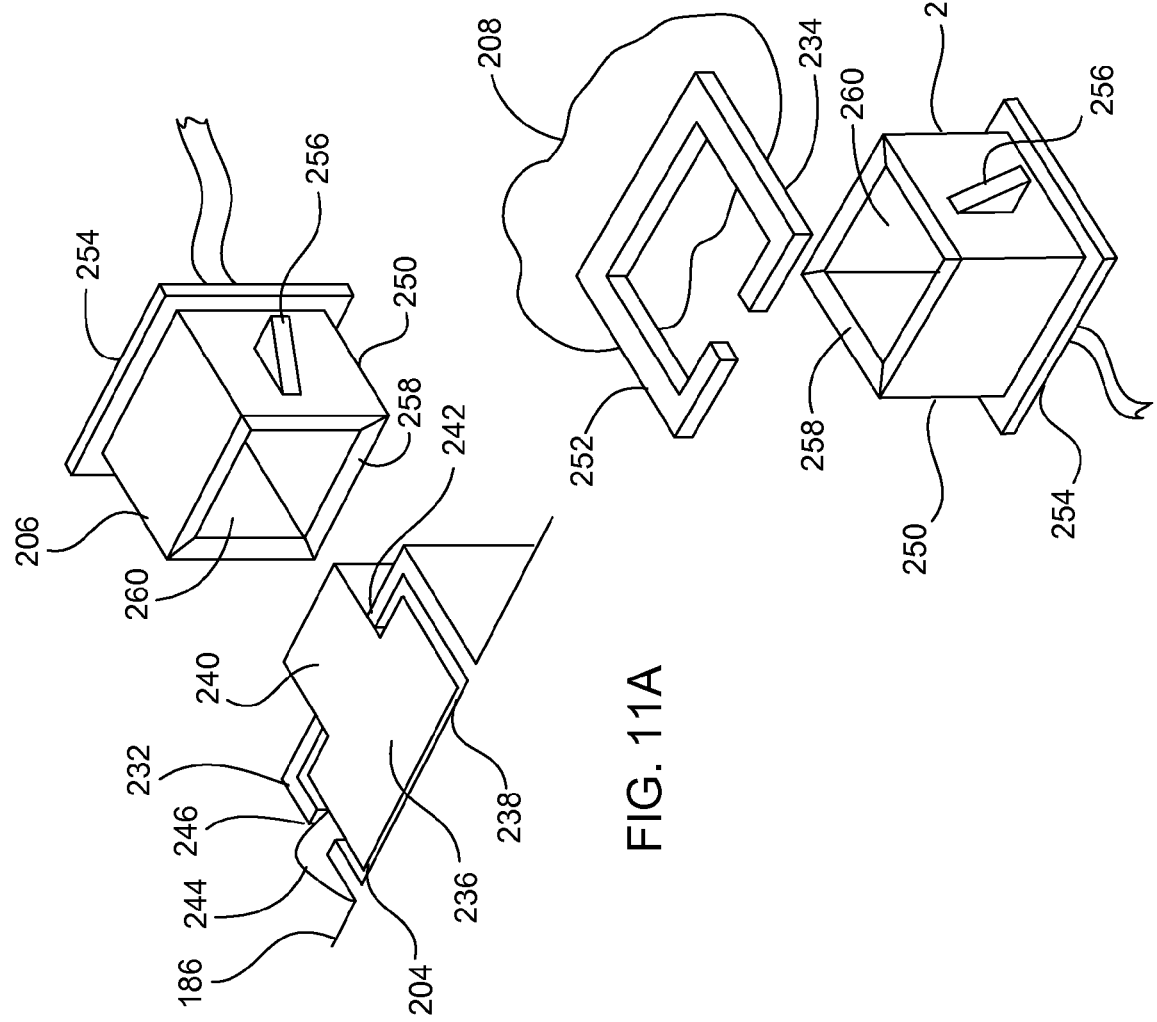

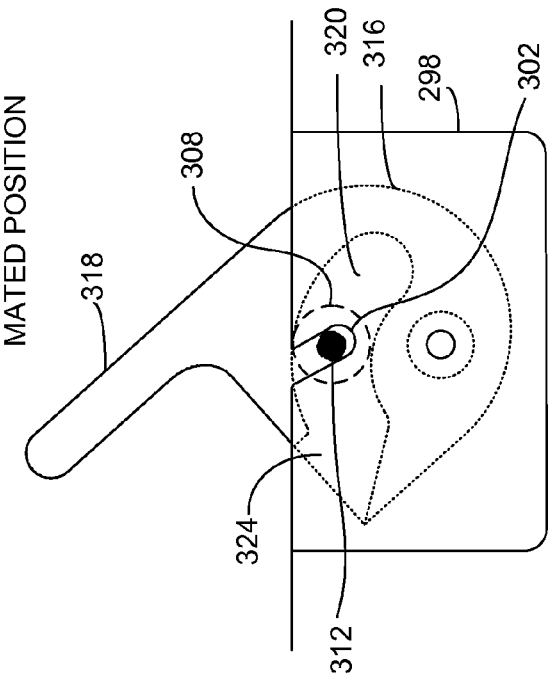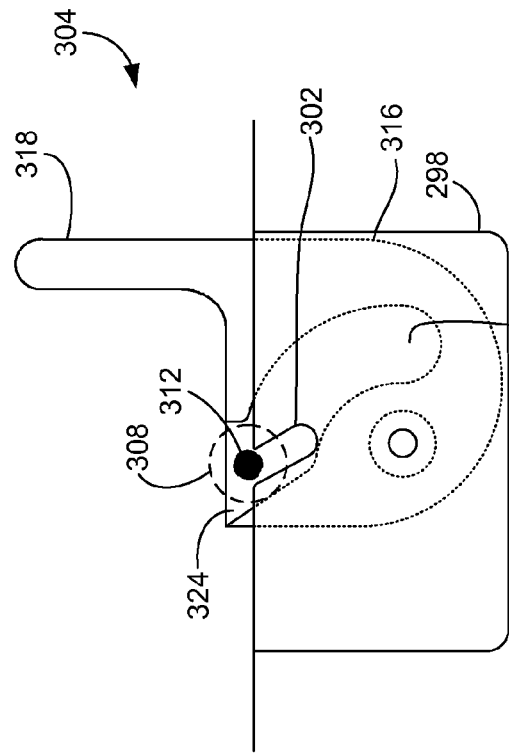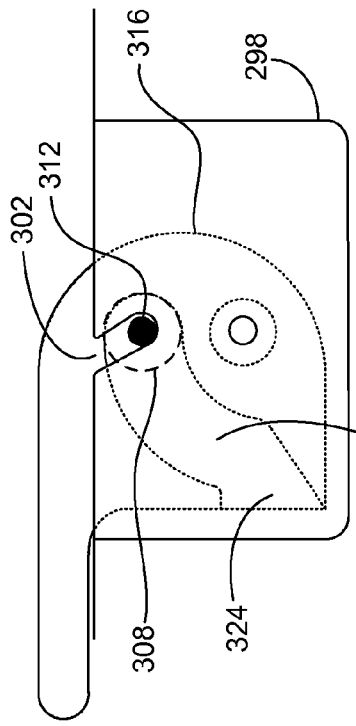

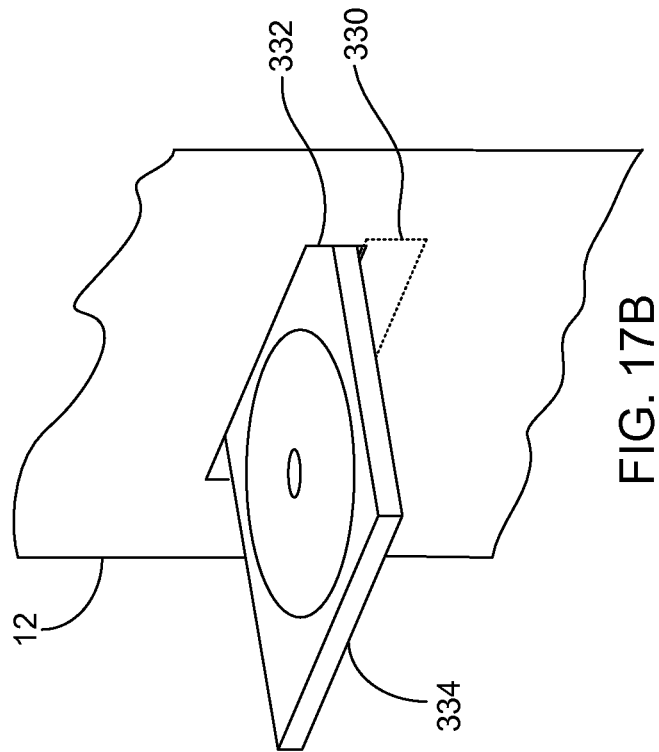
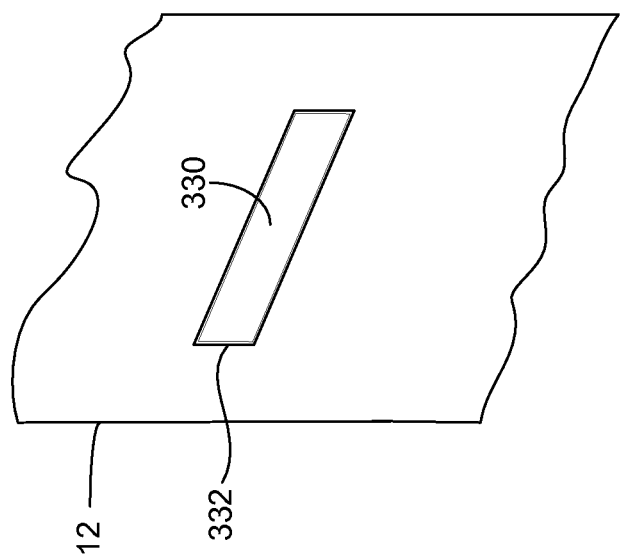
FIG. 17B
FIG. 17A

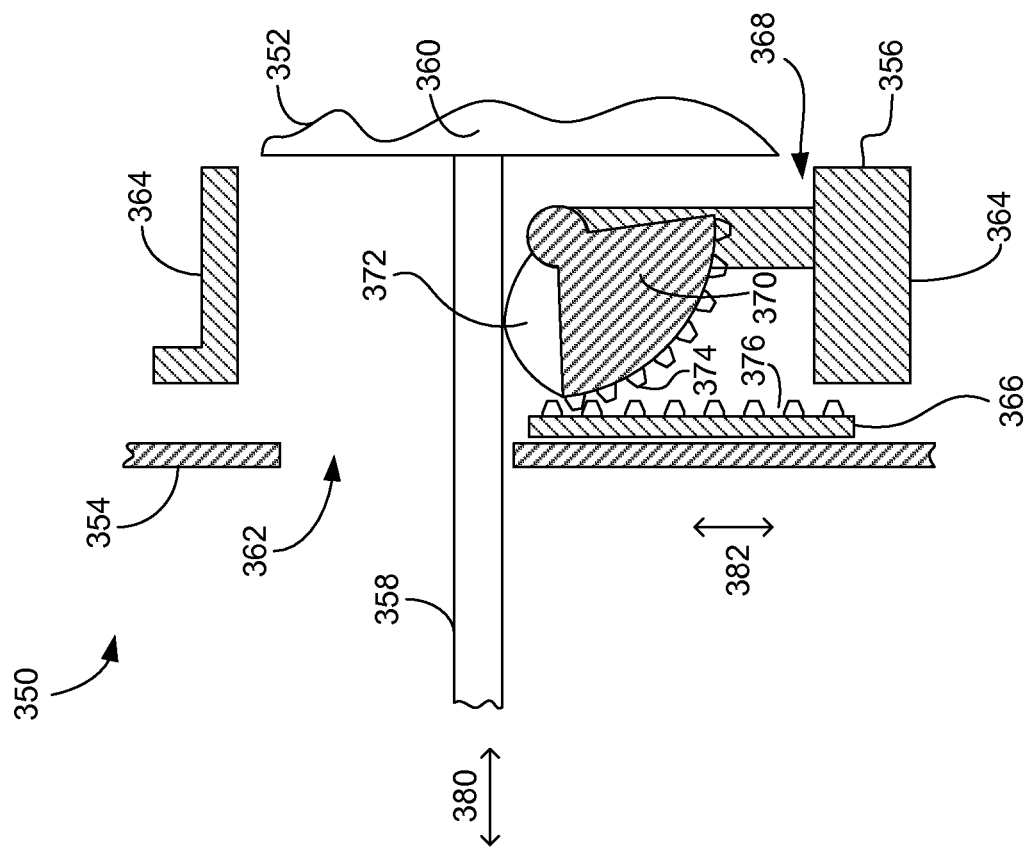
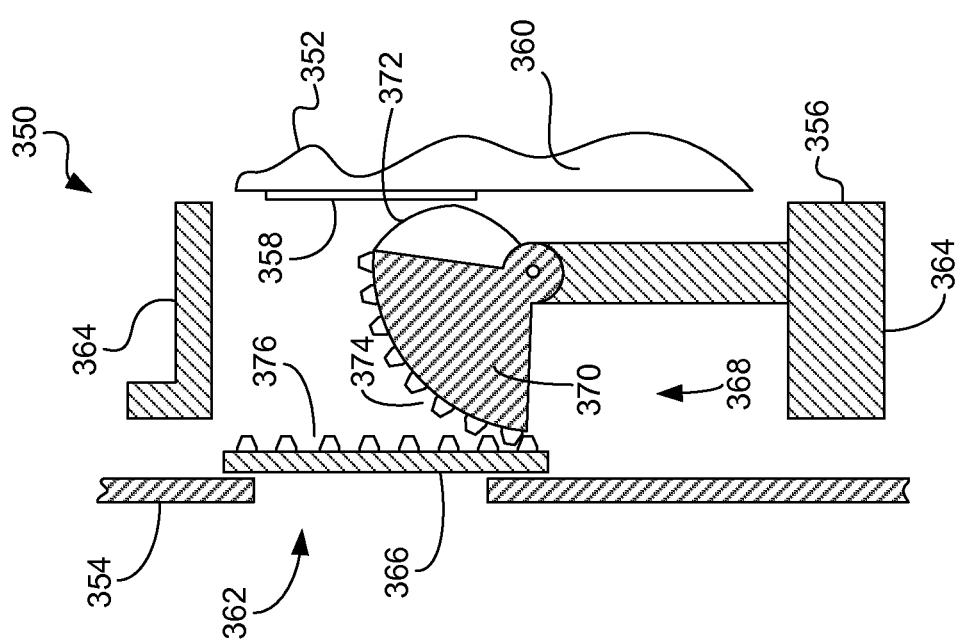
FIG. 18B
FIG. 18A

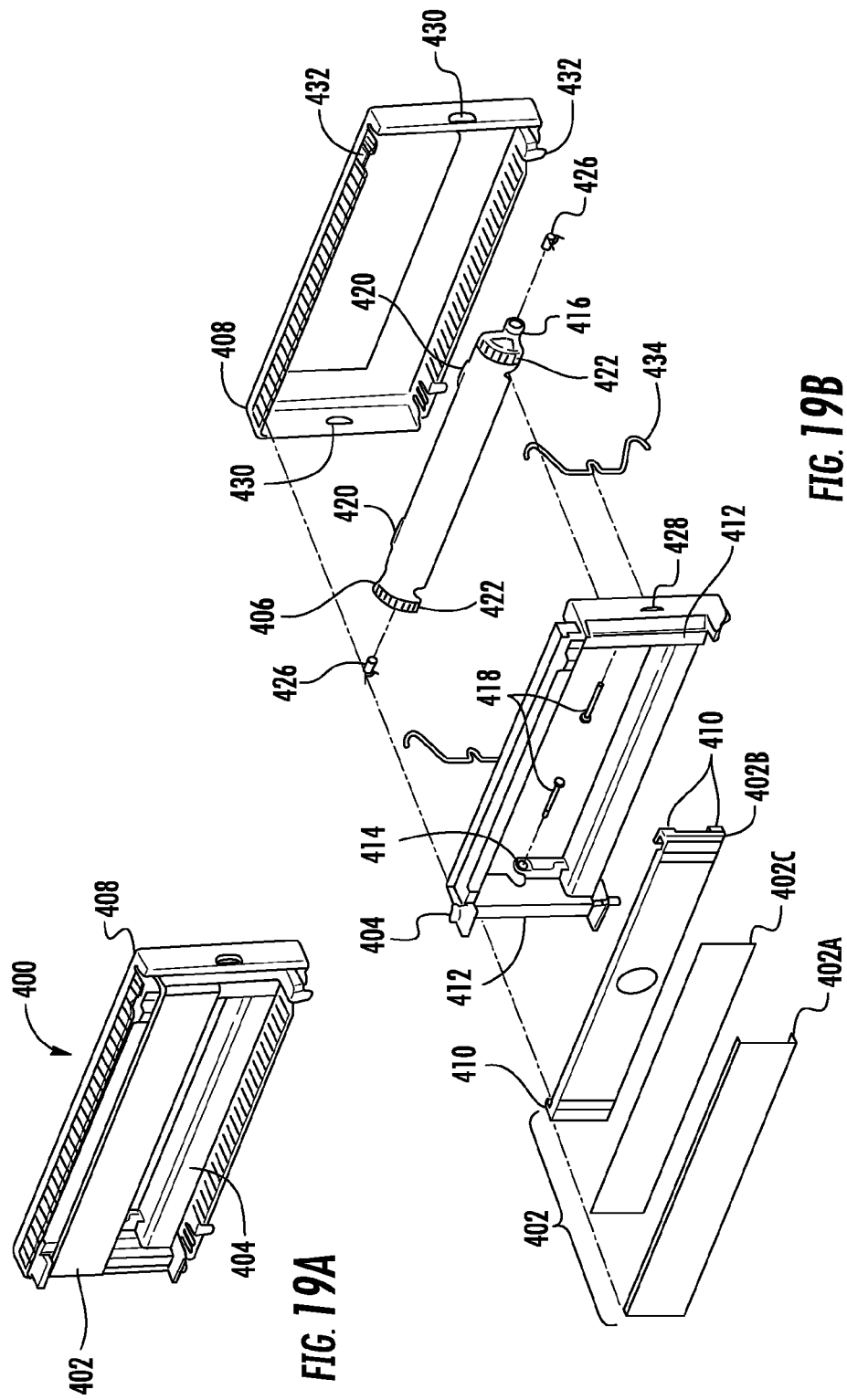

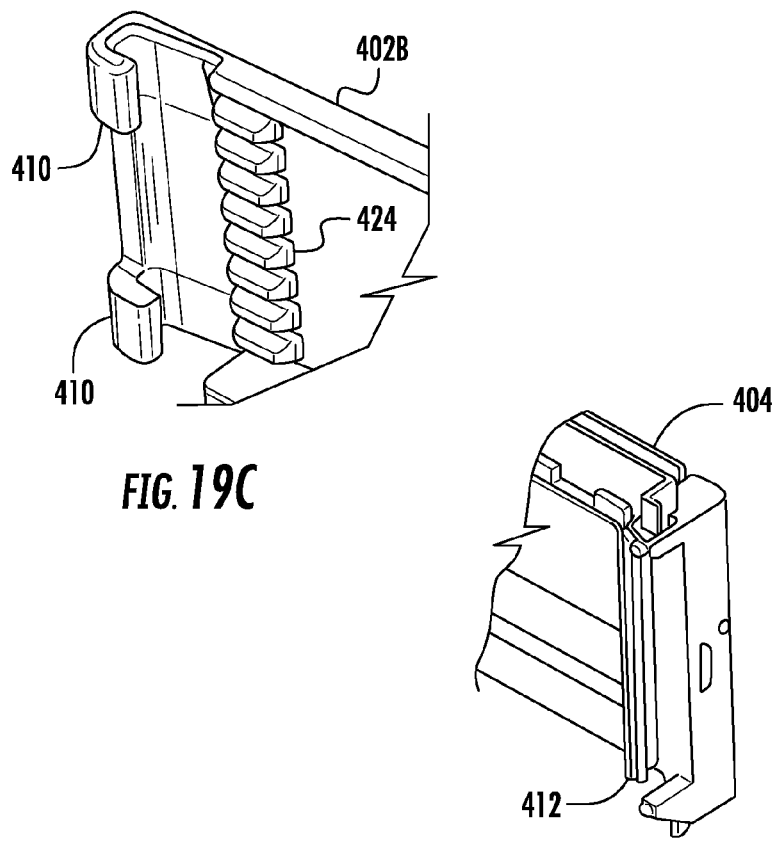
FIG. 19C
FIG. 19D
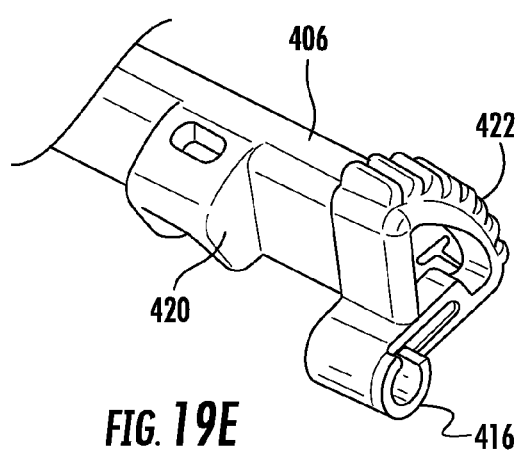
FIG. 19E

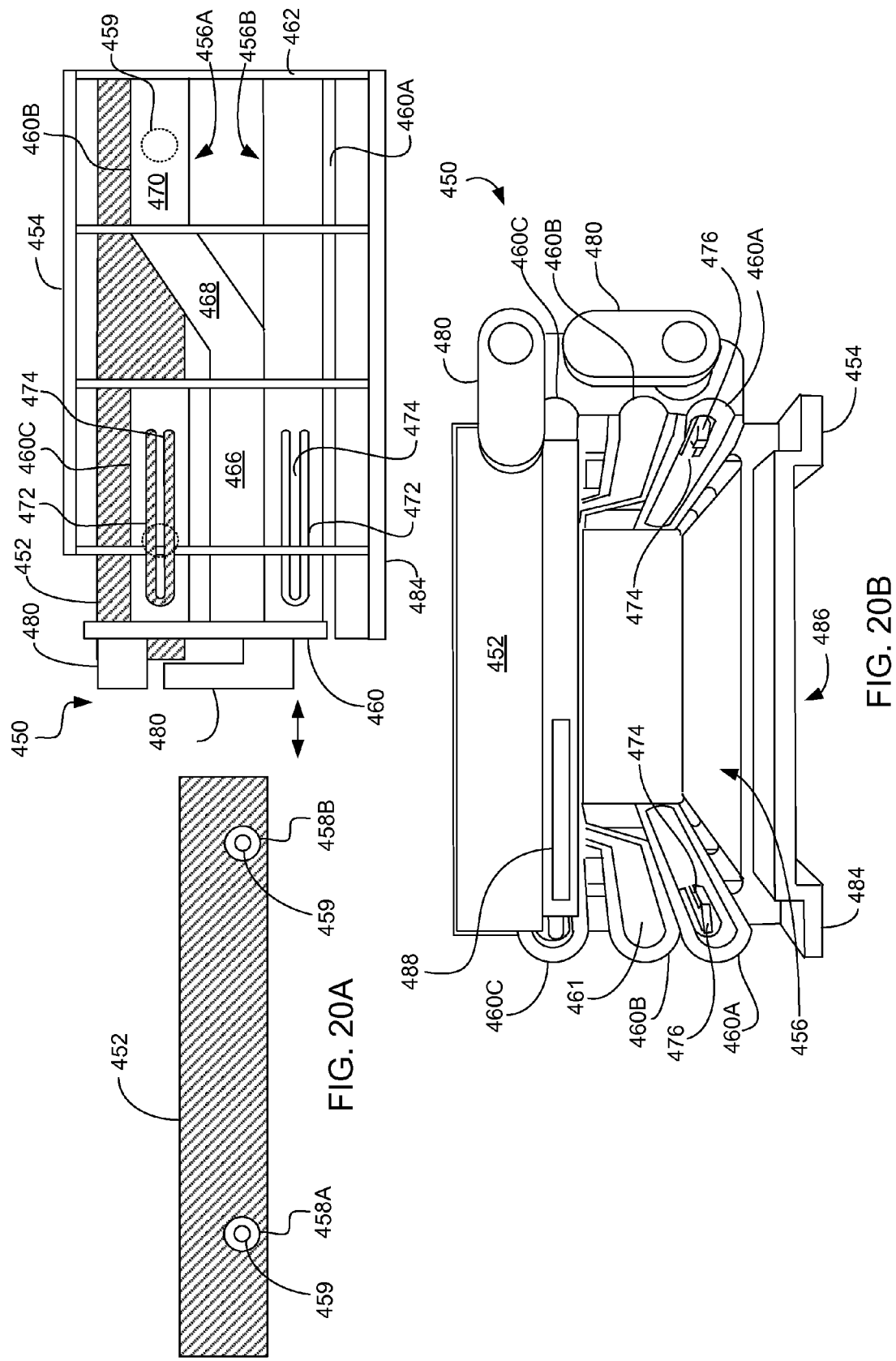

QUICK RELEASE STRUCTURES FOR A COMPUTER

CROSS REFERENCE TO RELATED APPLICATIONS

This patent application is a divisional of U.S. patent application Ser. No. 10/791,997 entitled "QUICK RELEASE STRUCTURES FOR A COMPUTER" filed Mar. 2, 2004 now U.S. Pat. No. 7,242,576, which takes priority under 35 U.S.C. §119(e) of U.S. Provisional Patent Application Ser. No. 60/535,279 entitled "QUICK RELEASE STRUCTURES FOR A COMPUTER" filed Jan. 8, 2004, each of which are incorporated by reference in their entirety.

BACKGROUND OF THE INVENTION

1. Field of the Invention

The present invention relates generally to a computer. More particularly, the present invention relates to improved features for mounting structures to a computer.

2. Description of the Related Art

There are many design challenges associated with designing a computer. One design challenge is in techniques for providing access to structures contained within the housing of the computer. One technique includes disassembling the entire housing or portions thereof. Another technique includes removing a door built into the housing. Unfortunately, there are many problems associated with these techniques. For example, disassembly and removal is often difficult for users who lack the time, tools and skills to perform such tasks. As should be appreciated, doors and housings are fastened using screws, bolts, snaps, locks, which can be difficult to maneuver. In addition, these techniques typically complicate the housing design and create aesthetic difficulties because of undesirable cracks and fasteners located along the surfaces of the housing (e.g., as for example at the mating surfaces).

To elaborate, if a user wants to gain access to an internal component of the computer, such as memory, the user has to spend a certain amount of time removing the fasteners to open the door. Furthermore, the removal of fasteners requires the user to have special tools and often some general technical skill in order to remove the trap door. Conventional doors also often need to be pried out from the housing in order to be removed. Typically, the trap doors do not provide surfaces for grasping with a finger or hand. In some applications this makes the door difficult to remove. In effect, a prying tool may be needed to remove the door from the housing.

Another design challenge is in techniques for mounting structures within the computer. Conventionally, the structures have been attached to the frame of the computer housing with fasteners such as screws, bolts, grommets or snaps. In order to remove the structures from the computer, it is often necessary to unfasten and remove each of the fasteners securing the structures to the frame or housing. Unfortunately, this is time consuming and cumbersome process. Furthermore, it requires tools and more than one hand. Thus, those users without tools or those users with physical limitations may not be able to remove the structures from the computer.

To cite an example, most structures include a mounting portion having multiple mounting holes. In order to install the structure into the computer, screws are typically placed through the mounting holes and threaded into brackets attached to a frame or a portion of the housing. In order to remove the structure from the computer, such as for example repair, replacement or to gain access to other components in the computer, each of the screws must be unfastened from the bracket. Unfastening the screws permits the structure to be disengaged from the bracket thereby releasing the structure from the computer. Both procedures are time consuming and cumbersome, especially in confined areas of the computer. Furthermore, both procedures require a screwdriver or other tool to tighten or untighten the screw.

Thus, there is a need for improvements in the manner in which structures are mounted to computers. One area not specifically addressed by the prior art is the ability to quickly and effectively provide both the easy and quick connection and disconnection of structures to and from the computer.

SUMMARY OF THE INVENTION

The invention relates, in one embodiment, to a computer. The computer includes a housing having an interior portion. The computer also includes a removable fan module that slides in and out of the interior portion of the housing. The fan module is configured to make tool-less electrical and mechanical connections with the computer when the fan module is slid into the housing. The fan module is additionally configured to make tool-less electrical and mechanical disconnections with the computer when the fan module is slid out of the housing.

The invention relates, in another embodiment, to a cooling device for a computer that includes a housing having an interior portion. The cooling device includes a quick release removable fan module that slides in and out of the interior portion of the housing, the fan module making tool-less electrical and mechanical connections with the computer when the fan module is slid into the housing, the fan module making tool-less electrical and mechanical disconnections with the computer when the fan module is slid out of the housing.

BRIEF DESCRIPTION OF THE DRAWINGS

The invention will be readily understood by the following detailed description in conjunction with the accompanying drawings, wherein like reference numerals designate like structural elements, and in which:

FIG. 6A is a side elevation view, in cross section, of a latching mechanism in a closed position, in accordance with one embodiment of the present invention.

FIG. 6B is a top view, in cross section, of a hooking mechanism in a closed position, in accordance with one embodiment of the present invention.

FIG. 6C is a front view of a handle and pocket system in a closed position, in accordance with one embodiment of the present invention.

FIG. 7A is a side elevation view, in cross section, of a latching mechanism in an open position, in accordance with one embodiment of the present invention.

FIG. 7B is a top view, in cross section, of a hooking mechanism in an open position, in accordance with one embodiment of the present invention.

FIG. 8A is a side elevation view, in cross section, of a latching mechanism in an open position, in accordance with one embodiment of the present invention.

FIG. 8B is a side elevation view, in cross section, of a latching mechanism in a closed position, in accordance with one embodiment of the present invention.

FIGS. 11A-11B are perspective views of a connector assembly, in accordance with one embodiment of the present invention.

FIGS. 16A-C illustrate a sequence of movements as the disk drive is latched and unlatched, in accordance with one embodiment of the present invention.

FIGS. 17A-17B are perspective diagrams showing a drive door that slides linearly up and down relative to the computer housing between an opened and closed position, in accordance with one embodiment of the present invention.

FIGS. 18A and 18B show a side elevation view of a disk drive system, in accordance with one embodiment of the present invention.

FIGS. 19A-19E are assembly diagrams of a drive door assembly, in accordance with one embodiment of the present invention.

FIGS. 20A and 20B are diagrams of a hard drive mounting system, in accordance with one embodiment of the present invention.

DETAILED DESCRIPTION OF THE INVENTION

The invention pertains to computer designs that improve user satisfaction. The designs are configured to incorporate one or more quick release couplings for releasably coupling components of a computer to the computer, i.e., a temporary connection means for connecting and disconnecting components to a computer. The quick release coupling mechanisms are generally configured to allow tool-less placement of the components relative to the computer. That is, the quick release coupling mechanisms are configured to perform their couplings without using conventional fasteners such as screws, bolts, etc. By eliminating the use of fasteners, the components may be inserted and removed from the computer without using tools (e.g., tool-less). Furthermore, the quick release couplings are easy to maneuver thereby enabling quick and straightforward assembly and disassembly of the components to and from the computer (e.g., quick release). For example, the components may be inserted and removed by a simple pushing or pulling motion, and/or by a simple flick of a latch or handle.

One aspect of the invention pertains to a door mount assembly that allows tool-less placement of an access door to the computer. Another aspect of the invention pertains to a fan mount assembly that allows tool-less placement of one or more fans inside the computer. Another aspect of the invention pertains to a drive mount assembly that allows tool-less placement of a disk drive inside the computer. Another aspect of the invention pertains to drive door assembly that includes a sliding door and that allows tool-less placement of a sliding door relative to the computer.

Embodiments of the invention are discussed below with reference to FIGS. 1-20. However, those skilled in the art will readily appreciate that the detailed description given herein with respect to these figures is for explanatory purposes as the invention extends beyond these limited embodiments.

Figure 1:
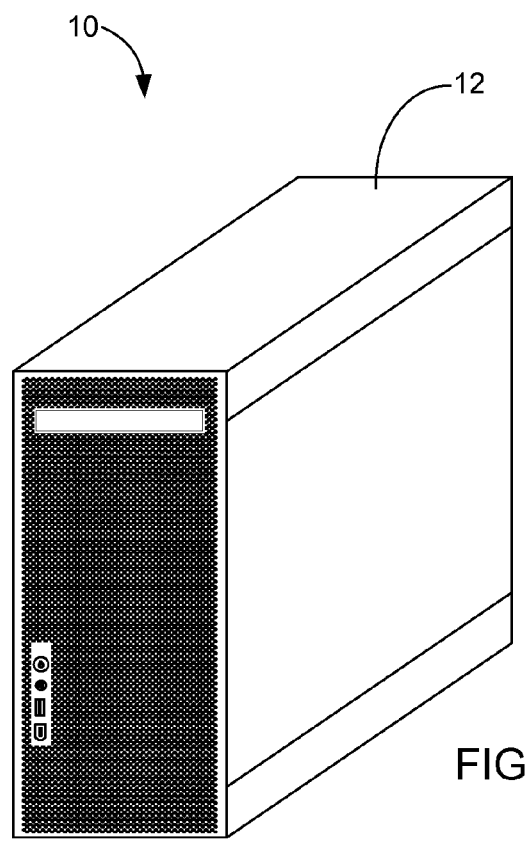
FIG. 1 is perspective view of a computer, in accordance with one embodiment of the present invention.

FIG. 1 is a perspective diagram of a computer 10, in accordance with one embodiment of the invention. The computer 10 generally includes a housing 12 configured to enclose various internal components that provide computing operations for the computer 10. The internal components may be processors, controllers, memory and the like. Often these internal components take the form of integrated circuits; however, the internal components can take various other forms including circuit boards, cables, connectors, fans, heat sinks, power supplies, etc. The internal components may also be various I/O devices such as a hard drive, a disk drive, a modem and the like. The housing 12 may also enclose various structural members, which may or may not be part of the housing 12. By way of example, the structural members may be ribs, bars, frames, shelves, platforms and the like that are directly or indirectly attached to the housing 12.

In general, the housing 12 serves various functions including but not limited to surrounding the internal components at a peripheral region thereof so as to cover and protect them from adverse conditions; structurally supporting the internal components in their assembled position within the housing 12; and defining the shape or form of the computer 10. The housing 12 may be further configured to contain electronic emissions therein, i.e., integrated circuit chips and other circuitry may generate unwanted electrical emissions (EMI).

Figure 2:
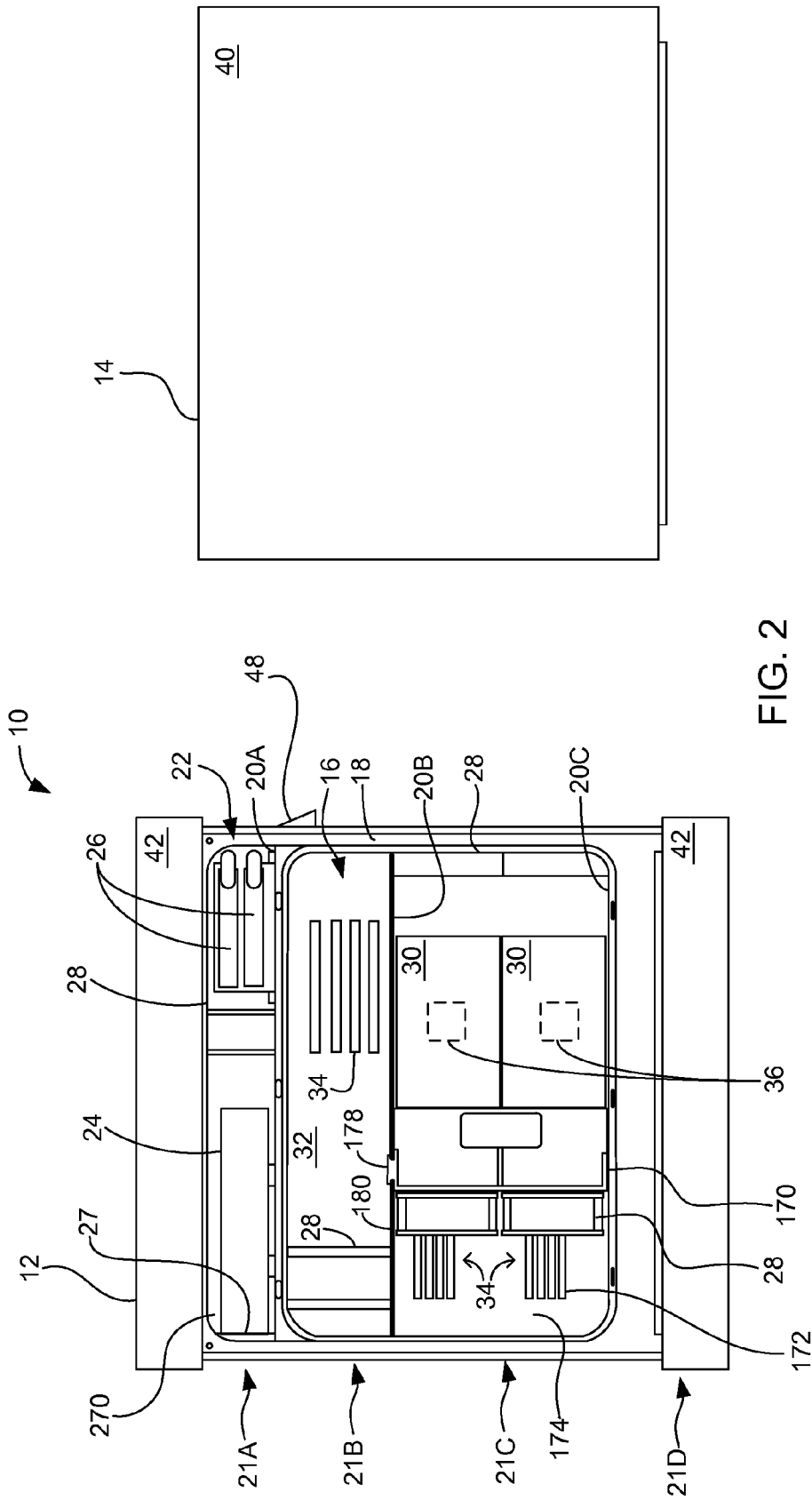
FIG. 2 is side view of the computer of FIG. 1 with an access door removed, in accordance with one embodiment of the present invention.

FIG. 2 is a broken away side elevation view of the computer 10 shown in FIG. 1. In this particular embodiment, a portion of the housing 12 has been removed to show the internal components of the computer 10. The portion of the housing 12 that has been removed may, for example, be an access door 14 that can cover an access opening 16 located in housing 12. The access door 14 when removed from the housing 12 allows the user access to various internal components enclosed within the housing 12. The access door 14 when attached to the housing 12 acts like part of the housing 12, i.e., helps enclose the internal components.

As shown through the opening 16, the computer 10 includes various other structural components including an access frame 18 and one or more shelves 20. The access frame 18 is configured to support the housing 12 in the area of the access opening 16. By way of example, it may act as a beam/post that connects and rigidly supports the housing 12 in its assembled condition. The shelves 20, on the other hand, are configured to support various internal components that provide operations for the computer 10. They are also configured to separate the internal housing into several usable spaces or stations capable or receiving the internal components of the computer. By way of example, the shelves may define a drive area, a PC card area, a processing area, a power management area, and/or the like. The spaces may also separate the housing into one or more different thermal zones.

In the illustrated embodiment, the access frame 18 is attached to the upper portion of the housing 12 at a first end and a lower portion of the housing 12 at a second end. It may also be attached to the front and rear portion of the housing 12. This is generally accomplished with fasteners such as screws, bolts, etc. The access door 14 is configured to mate with the access frame 18 when the access door 14 is mounted to the housing 12. In most cases, the access door 14 is placed within a cut out section 22 in the housing 12. In some cases, it may be desirable to provide an inner door between the access door 14 and the opening 16 in the housing 12 to further protect the internal components and possibly add more functionality to the computer. For example, the inner door may include contours that help distribute air throughout the internal portions of the housing, and more particularly different thermal zones within the housing.

The manner in which the access door 14 is removed generally varies according to the specific design of each computer 10. For example, it may be designed to slide off of the housing 12 or it may be rotated off the housing 12. Further, although the door 14 is shown removed, it should be noted that this is not a limitation and that the access door 14 may be movably coupled to the housing 12. For example, it may pivot or slide relative to the housing 12 without being removed.

As further shown through the opening 16, the housing 12 encloses various internal components that provide operations to the computer 10. For example, the housing 12 may enclose a disk drive 24 and one or more hard drives 26, each of which may be mounted to a first shelf 20A in order to secure them within the housing 12. The housing may include an opening or a door system 27 for allowing access to the disk drive 26. The housing 12 may also enclose various heat transfer mechanisms as for example, fans 28, heat sinks 30 and the like. The fans 28, which are typically mounted to various shelves 20, may for example be configured to pull air from the front of the housing 12 via a plurality of perforations in the housing 12 and to distribute the air over the computer components enclosed within the housing 12. Once the air has collected heat from the computer components, it is generally directed out of the housing 12 through one or more vents (or perforations) in the back of the housing 12.

The housing 12 may also enclose a mother board 32, which in this embodiment is located behind the various other components opposite the access door 14. The motherboard 32 provides a place where a majority of the computer components can meet. It also provides a foundation for various computer components. For example, the mother board may include a plurality of slots 34 for receiving such things as PC cards, videocards, memory (e.g., SIMMs or DIMMs), and the like. It also includes thereon, one or more main processors 36 that control the computer 10. As shown, the heat sinks 30 are typically positioned over the main processors 36 so as to collect heat therefrom.

As the power and sophistication of computers have increased, so has the level of electromagnetic interference generated by devices enclosed therein. As is generally well known, integrated circuit devices unintentionally emit electromagnetic radiation during operation that may cause interference with communication devices, such as telephones, radios, and televisions. In order to prevent interference, the housing 12 as well as the access door 14 may be configured to shield or block the emission of electromagnetic radiation, which is emanating from the integrated circuit devices. This is generally accomplished with an electrically conductive material that forms part of the housing/door or that is attached to housing/door. In plastic housings, some methods for shielding the housing include: lining the housing with a metallic foil such as aluminum, lining the housing with sheet metal such as steel, or coating the inner surfaces of the housing with a metallic material such as nickel or copper. Alternatively, the housing may be formed from an electrically conductive material itself as for example steel or aluminum. Furthermore, the door or its corresponding mating surface on the housing may include an EMI gasket for shielding interference at the interface between the housing 12 and the access door 14. By way of example, the EMI gasket may be a silicone based electrically conductive EMI gasket.

In accordance with one aspect of the present invention, a quick release door system is provided that is quick and easy to maneuver. The quick release door system generally includes a removable access door 14 that covers an opening 16 in the housing 12 and acts as another wall of the housing 12 when closed (FIG. 1) and that allows access through the opening 16 when opened (FIG. 2). Although not a requirement, the housing 12 may include a cutout or recessed portion 22 therein for receiving the removable access door 14. The recessed portion 22 provides a mating interface for the access door 14 relative to the housing 12. In most cases, the recessed portion 22 is designed to place the outer surface 40 of the access door 14 substantially flush with the outer surface 42 of the housing 12 adjacent the access door 14 when the access door 14 is disposed within the recessed portion 22. The recessed portion 22 is also designed to reduce gaps between the access door 14 and the housing 12. Both design features are generally done to provide a clean and continuous appearance that is aesthetically pleasing to the user. They may also help hide the fact that an access door 14 exists in the housing 12, i.e., trap door or hidden door. This may be done irrespective of whether the housing 12 has a curvilinear contour or rectilinear contour (as shown).

The configuration of the access door 14 may be widely varied. For example, it may be located on a single wall (as shown) or multiple walls of the housing 12. The access door 14 may further make up an entire wall of the housing 12 or smaller portions thereof (as shown). In addition, the shape of the access door 14 may coincide with the overall contour of the housing 12 or it might provide further contours whether internal or external. In the illustrated embodiment, the access door 14 is located on a single wall. It is further dimensioned to be somewhat smaller than the entire wall, i.e., the housing 12 as well as the access door 14 form the entire wall. Moreover, the access door 14 is substantially planar (flat) in order to coincide with the planar contour of the housing 12. It is generally believed that the embodiment shown is desirable to a user of the computer for both aesthetics and ease of use. For example, it provides a clean continuous appearance and it is easy to maneuver compared to other designs.

The quick release door system also generally includes a quick release latching mechanism for securing the access door 14 to the housing 12 when closed and for releasing the access door 14 from the housing 12 when it is desired to be opened. The quick release latch mechanism consists of two parts, a housing side locking mechanism and a door side locking mechanism. These two mechanisms are cooperatively positioned so that when the access door 14 is closed, the locking mechanisms are capable of lockably engaging with one another thus securing the access door 14 to the housing 12. The quick release latching mechanism also includes a quick release latch that enables a user to easily and quickly lock and unlock the door side locking mechanism relative to the housing side locking mechanism (or vice versa) thereby securing or releasing the access door 14 from the housing 12 in a simple and easy manner.

Figure 3:
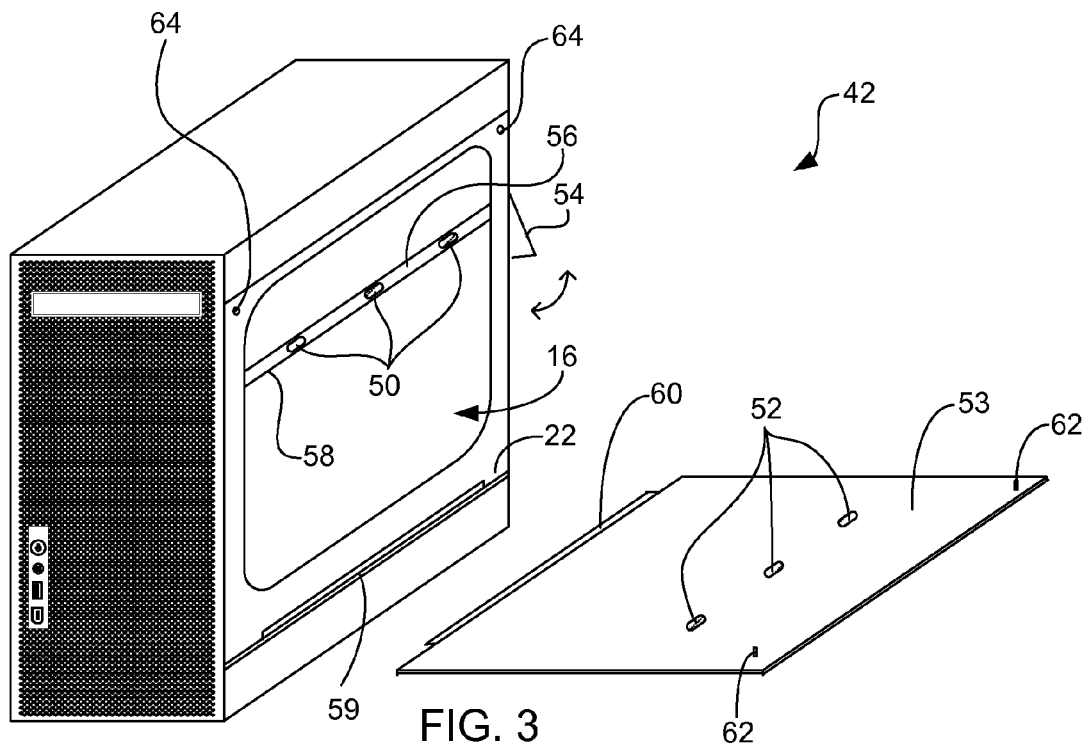
FIG. 3 is perspective view of the computer of FIG. 1 with an access door removed, in accordance with one embodiment of the present invention.

Referring to FIG. 3, one embodiment of a quick release latching mechanism 42 will be described. As shown, the quick release latching mechanism 42 includes a plurality of retention hooks 50 located on the housing 12 that mate with a plurality of hook receivers 52 located on the access door 14. The retention hooks 50 are configured to engage the hook receivers 52 to hold the access door 14 in place. The retention hooks 50 and hook receivers 52 can be widely varied. In the implementation shown, the retention hooks 50 are flange like hooks that protrude away from the housing 12 and the hook receivers 52 are slots built into the access door 14. The slotted hook receivers 52 are capable of receiving the flange like hooks 50 therein.

As shown, the retention hooks 50 are positioned within the opening 16 in the housing 12, and the hook receivers 52 are positioned on an inner surface 53 of the access door 14. The retention hooks 50 are generally movable between an engagement position, coupling the retention hooks 50 with the hook receivers 52, and a disengagement position, decoupling the retention hooks 50 from the hook receivers 52. When engaged, the access door 14 is secured to the housing 12. When disengaged, the access door 14 can be removed from the housing 12. The latching mechanism 42 may further include a quick release handle 54 for moving the retention hooks 50 between the engagement and disengagement positions. The quick release handle 54 is generally located in an inconspicuous place as for example at the rear of the computer 10. The quick release handle 54 is also designed for ease of use and one handed operation.

Although the retention hooks 50 may be moved in a variety of ways in order to engage the hook receivers 52 (e.g., rotate, translate, pivot, etc.), in the illustrated embodiment, the retention hooks 50 are configured to slide relative to the housing 12. In particular, the retention hooks 50 are attached to a slider bar 56 that is slidably retained to a frame component 58 contained in the housing 14. By way of example, the frame component may generally correspond to a portion of the access frame 18 shown in FIG. 2. The sliding action is initiated by actuation of the quick release handle 54. Like the retention hooks 50, the handle 54 may be moved in a variety of ways (e.g., rotate, translate, pivot, etc.) to initiate the sliding action. In the illustrated embodiment, the handle 54 is configured to pivot relative to the housing 12 in order to produce the sliding action, i.e., the pivoting action of the handle 54 produces the sliding action at the retention hooks 50. Although not shown in this Figure, the quick release latching mechanism 42 generally includes some means for transforming pivot motion of the handle 54 into linear motion of the slider bar 56 and thus the retention hooks 50.

When the access door 14 is positioned within the recessed portion 22 of the housing 12, the retention hooks 50 are positioned adjacent the hook receivers 52 (e.g., disengagement position). In order to secure the access door 14 to the housing 12, the user forces the handle 54 to pivot. The pivoting action causes the retention hooks 50 to slide thereby capturing the hook receivers 52 (e.g., engagement position). When captured, the access door 14 is held relative to the housing 12. In some cases, it may be necessary to provide a means for forcing the access door 14 tight against the housing 12 in order to seal the interface there between. In cases such as this, the retention hooks 50 and/or the hook receivers 52 may include a tapered portion or ramp that causes the access door 14 to move towards the housing 12 as the retention hooks 50 slide relative to the hook receivers 52. The tapered portion in essence causes the access door 14 to be sucked into the recessed portion 22 of the housing 12. A spring action may be used to control the feel of the sucking action (e.g., tune the feel). For example, the retention hooks 50 and/or the hook receivers 52 may include a spring means that produces a smooth and constant friction force when the retention hooks 50 are slid into the hook receivers 52. As should be appreciated, it is generally believed that users think more positively about products that provide smooth actions rather than ones that produce coarse actions.

The door system may further include a door recess 59 located within the housing 12 and a retention lip 60 located on the access door 14. The door recess 59 receives the retention lip 60 so as to help secure the access door 14 to the housing 12 as well as to coarsely position the access door 14 relative to the housing 12. As should be appreciated, the retention hooks 50 and hook receivers 52 need to be aligned in order for them to properly engage one another. In some cases, the door interface needs finer positioning than what is provided by the recess/lip interface 59/60. In cases such as these, the door system may further include one or more alignment pins 62 located on the access door 14 and one or more locator holes 64 located on the housing 12 (or vice versa). When the alignment pins 62 are inserted into the locator holes 64, the access door 14 is placed in its proper position relative to the housing 12, i.e., prevents planar translation as well as rotation within the plane. Although the door recess 59 can be placed at any location, it is typically located somewhat internally of the outer surface of the housing 12 in order to allow the outer surface of the access door 14 to be flush with the outer surface of the housing 12.

The operation of the door system will now be discussed in conjunction with the illustrated embodiment. In order to remove the access door 14 from the housing 12, a user simply rotates the handle 54. By rotating the handle 54, the retention hooks 50 slide from the engagement position to the disengagement position. When in the disengagement position, the retention hooks 50 are decoupled from the hook receivers 52 and therefore the access door 14 is no longer secured to the housing 12 via the quick release latching mechanism 42. Thereafter, the user rotates the access door 14 away from the housing 12 about the retention lip/door recess interface 59/60 thereby removing the flange like retention hooks 50 from the slotted hook receivers 52. This rotation also releases the alignment pin 62 from the locator hole 64. Once the access door 14 is free from the retention hooks 50 and locator hole 64, the user may simply lift up on the access door 14 to release the retention lip 60 from the door recess 59. Once released, the access door 14 is fully removed form the housing 12.

In order to connect the access door 14 to the housing 12, a user places the retention lip 60 within the door recess 59 and rotates the access door 14 about this interface. At the end of the rotation, the user guides the alignment pin 62 into the locator hole 64 thereby placing the access door 14 in the desired relationship with the housing 12. By placing the access door 14 in the proper position, the retention hooks 50 are placed in the proper position relative to the hook receivers 52. Thereafter, the user rotates the handle 54 thereby causing the retention hooks 50 to slide from the disengagement position to the engagement position. When in the engagement position, the retention hooks 50 are coupled to the hook receivers 52 and therefore the access door 14 is secured to the housing 12 via the quick release latching mechanism 42.

Figure 4:
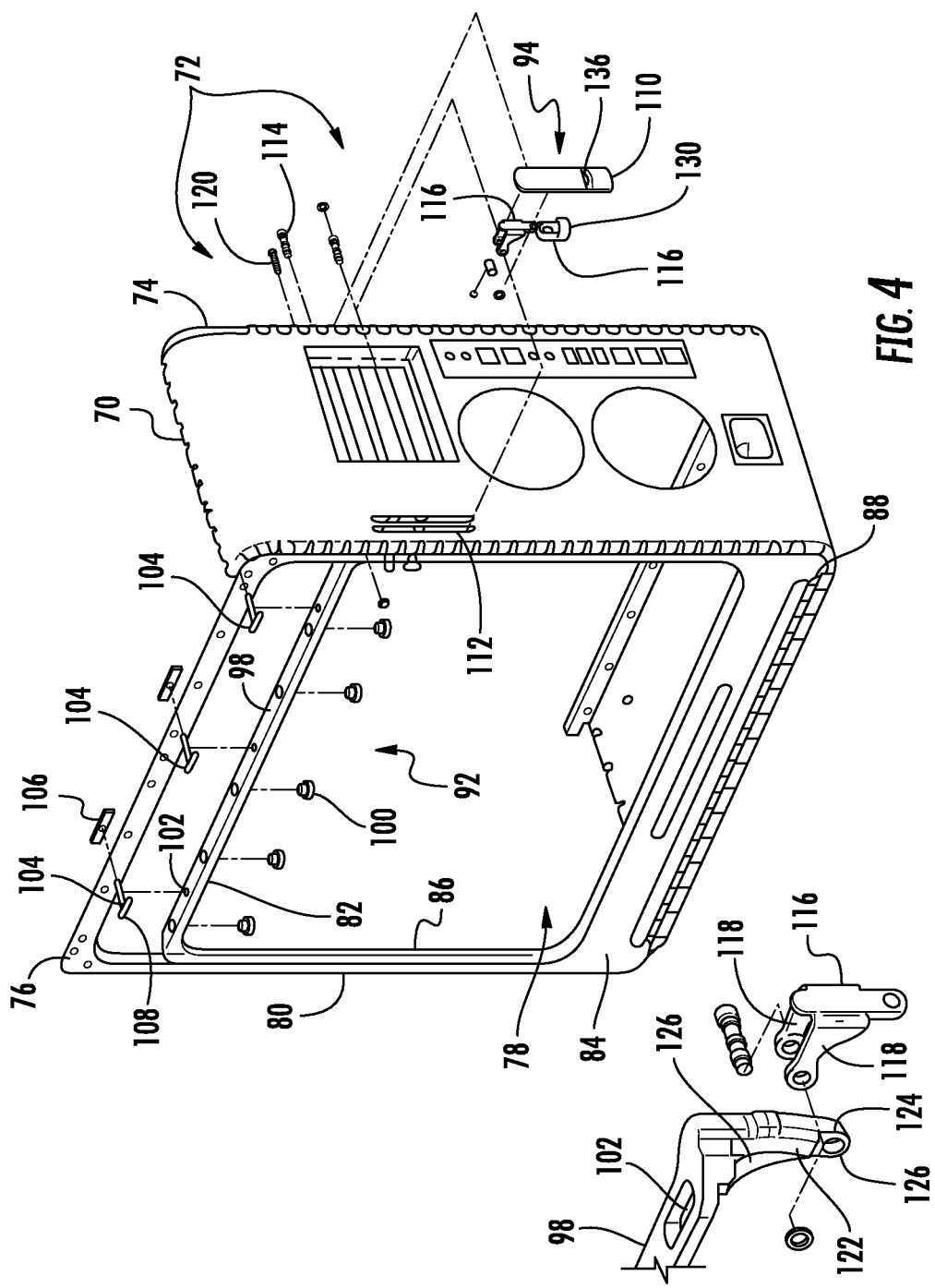
FIG. 4 is an exploded perspective view, in part, of a housing including a quick release door system, in accordance with one embodiment of the present invention.

Referring to FIGS. 4-8, a quick release door system 68 will be disclosed, in accordance with one embodiment of the present invention. The quick release door system includes a housing 70, a removable door 71 and a quick release latching mechanism 72. By way of example, these components may generally correspond to similar features shown and described in FIGS. 1-3. As shown in FIG. 4, the housing 70 includes a casing 74 and an access frame 76. The access frame 76 is attached to the casing 74. The access frame 76 supports the casing 74 in the area of an access opening 78 and generally receives an access door (FIG. 5), which covers the access opening 78. The access frame 76 may be attached to the casing 74 in any conventional manner as for example fasteners such as screws and bolts. The materials of the casing 74 and access frame 76 may be widely varied. They are generally selected for various reasons including but not limited to structural integrity and EMI shielding. In one particular embodiment, the casing 74 is formed from aluminum and the access frame 76 is formed from steel.

The access frame 76 includes a main body 80 and a support bar 82. The main body 80 provides support to the casing 74 and the support bar 82 provides support to a quick release latching mechanism 72. It may also provide support for a shelf disposed inside the housing 70. The main body 80 also defines the access opening 78 and generally includes a mating surface 84 for receiving the inner surface of the access door 71 (FIG. 5). The main body 80 also includes a flange or stepped portion 86 that is located around the access opening 78. The flange portion 86 is configured to receive a protruding portion or stiffener 154 located on an inner surface of the access door 71 so as to seal the interface between the access opening 78 and the access door 71 (FIG. 5). The main body 80 also includes a door depression 88 that cooperates with a portion of the casing (not shown) to form a door recess, i.e., the casing covers a portion of depression across its length. The door recess is configured to receive a retention lip 162 of the access door 71 (FIG. 5).

Although not shown, the main body 80 may also be configured to receive an inner door that is positioned between the access door 71 and the access frame 76. The inner door may provide air flow contours for ducting air flow to various locations within the housing 70. The inner door may include one or more retention lips that fit into corresponding slots in the access frame 76, and a locking detent that interacts with the support arm 82. The inner wall may be formed from a clear plastic material. By way of example, an inner door that may be used is disclosed in patent application Ser. No. 10/075,964, entitled "Active Enclosure for Computing Device", filed on Feb. 13, 2002, now U.S. Pat. No. 7,45,098, and which is herein incorporated by reference.

The quick release latching mechanism 72 is used to removably couple the access door 71 to the housing 70. The quick release latching mechanism 72 includes a slider assembly 92 and a handle assembly 94. Referring first to the slider assembly 92, the slider assembly 92 includes a slider bar 98 that is slidably retained to the support bar 82. This is generally accomplished with shoulder bolts 100 that are mounted to the support bar 82. The shoulder bolts 100 pass through corresponding slots 102 in the slider bar 98 thereby slidably retaining the slider bar 98 to the support bar 82. This may also be accomplished with a channel like structure formed into the support bar 82. The slider assembly 92 also includes a plurality of retention hooks 104 that are slidably restrained to the slider bar 98. The retention hooks 104 may for example include fins that slide within a groove in the slider bar 98. The retention hooks 104 are held within the groove via a corresponding leaf spring 106 that attaches to both the slider bar 98 and the retention hooks 104. The leaf spring 106 allows the retention hooks 104 to move inward and outward under a spring bias. The retention hooks 104 also include a flange 108 that is used to capture a portion of the access door, and more particularly hook receivers built into the access door (FIG. 5).

Referring to the handle assembly 94, the handle assembly 94 includes a handle 110 that is pivot coupled to the housing 70, and more particularly casing 74. The handle 110 is seated inside a pocket 112 in the casing 74. In this manner, the outer surface of the handle 110 can sit substantially flush with the outer surface of the casing 74. In general, the size of the handle 110 is dimension for receipt inside the pocket 112 except for a small portion that provides a space for grasping the end of the handle 110. The pocket 112 may be integrally formed with the casing 74 or it may be a separate component that is attached to the casing 74 (e.g., weld). The handle 110 is connected to the casing 74 through a pivot pin 114 that is captured by a through hole in both the pocket 112 and the handle 110. A retaining ring may be used to hold the pivot pin 114 in place.

The handle assembly 94 also includes a pivot arm 116 that is attached to the backside of the handle 110. The pivot arm 116 includes a pair of arms 118, each of which includes a through hole for receiving a pivot pin 120. The pivot pin 120 may be held in its assembled position via a retaining ring. The pair of arms 118 are inserted through a pair of corresponding slots in the rear of the pocket 112. The pivot arm 116 may be attached to the handle 110 using any conventional means including but not limited to screws, bolts, adhesives and the like. Alternatively, the pivot arm 116 may be integrally formed with the handle 110.

The pivot arm 116 is both slidably and pivotally coupled to the slider bar 98 via the pivot pin 120, which is seated within the through holes of the pivot arms 118 and a groove 122 formed at the end of the slider bar 98. The slider bar 98 includes a protruding member 124 at the end closest to the handle 110. The protruding member 124 includes the groove 122 that receives the pivot pin 120 therein. The profile of the groove 122 is configured to cooperate with the handle 110 to transform the rotary motion of the handle 110 to the sliding motion of the slider bar 98. The groove 122 may include tuned humps 126 at its ends. The tuned humps 126 cause the handle 110 to retain its actuated and unactuated positions. They may also cause the handle 110 to produce a snap at the end of its rotation. For example, when the use pulls the handle 110 up, the tuned hump 126 causes the handle 110 to lock into its upwards position (and vice versa). The handle 110 may be spring biased as for example using a torsion spring or leaf spring The handle assembly 94 may further include a lock receiver 130 that cooperates with the handle 110. The lock receiver 130 is configured to receive a lock such as a padlock so as to prevent a user from using the handle 110. When prevented from using the handle 110, the access door cannot be removed and thus access through the access opening is prevented. The lock receiver 130 is disposed between the handle 110 and the pocket 112. The lock receiver 130 includes a first extension 132 and a second extension 134, each of which can be inserted through an opening 136 in the handle 110. The lock receiver 130 is configured to pivot within pocket 112 between a first position (as shown in FIGS. 6 and 7), placing the first extension 132 within the opening 136 in the handle 110, and a second position (as shown in FIG. 8), placing the second extension 134 within the opening 136 in the handle 110. In order to change the position of the lock receiver, the handle 110 is rotated upwards, as for example, in the opened position (FIG. 8A).

The first extension 132 is smaller than the second extension 134 such that its end is substantially flush with the outer surface of the handle 110 when it is positioned in the opening 136 in the handle 110. The second extension 134, on the other hand, is longer so that its end extends past the outer surface of the handle 110. The second extension 134 includes a through hole 138 so that when the second extension 134 is positioned in the opening 136 of the handle 110, a pad lock may be placed through the through hole 138 thereby preventing a user from using the handle 110. In order to enhance user feel of the lock receiver 130, a back portion of the lock receiver 130 may include a nub that produces a cam action relative to the casing 74. The cam action may be spring biased to further enhance the user feel. By way of example, a leaf spring located on the internal back side of the pocket 112 may be used to bias the cam action.

Figure 5B:
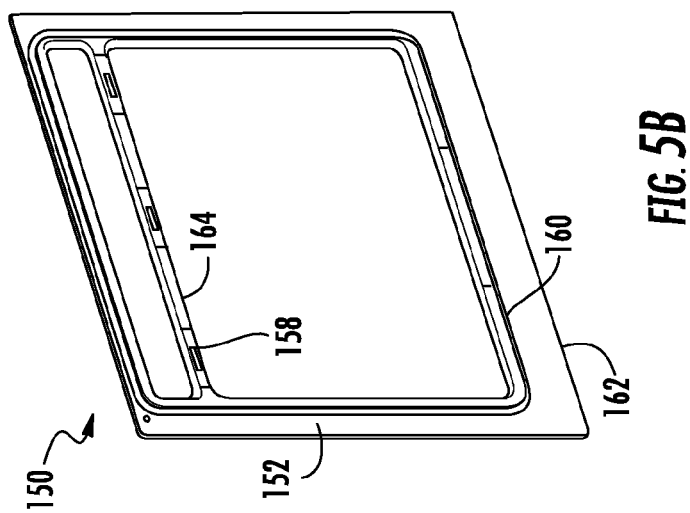
FIG. 5B is a perspective view of the access door of FIG. 5A as assembled, in accordance with one embodiment of the present invention.
Figure 5A:
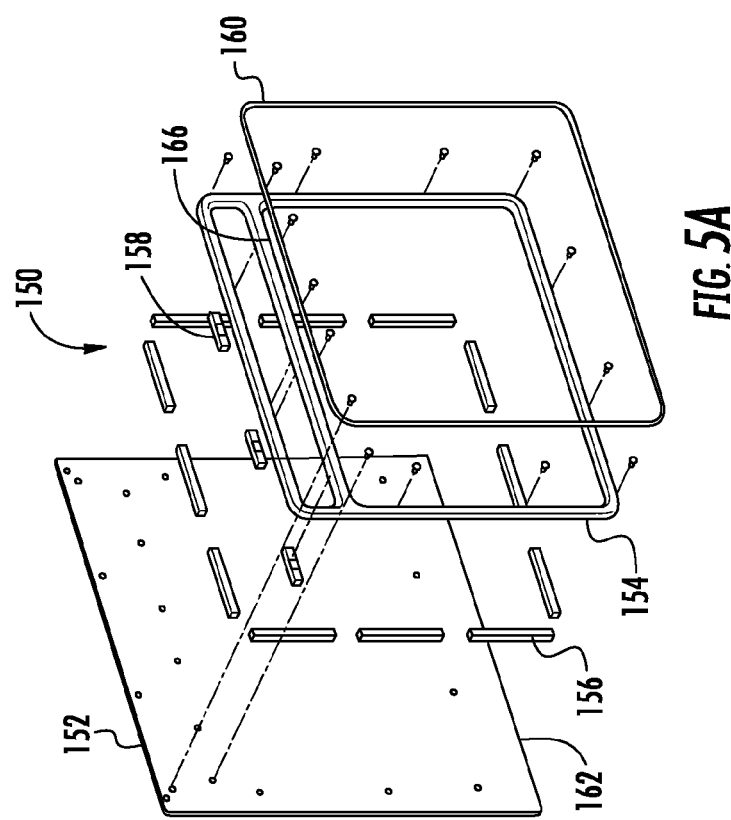
FIG. 5A is an exploded perspective view of an access door, in accordance with one embodiment of the present invention.

As shown in FIGS. 5A and 5B, the access door assembly 150 includes a planar access door 152, an access door stiffener 154, internal EMI gaskets 156, hook receivers 158 and an external EMI gasket 160. The access door 152 includes a retention lip 162 that is configured to be inserted into a door recess in the housing (see for example 88 in FIG. 4). The inner surface of the access door 152 around the stiffener 154 may mate with a corresponding surface in the housing (see for example 84 in FIG. 4).

The door stiffener 154, which helps prevent torsion and flexing of the access door 152, is attached to the inner surface of the access door 152. The door stiffener 154 may be attached using any conventional means as for example, screws or bolts. The stiffener 154 is generally configured to protrude away from the inner surface from the access door 152. The contour of the stiffener 154 generally coincides with a corresponding recess in the housing. That is, the protruding portion of the stiffener 154 may be inserted into a recess in the housing when the door is placed in its closed position (see for example 86 in FIG. 4). The stiffener 154 may include a cross bar 164, the placement of which corresponds to the placement of the latching mechanism on the housing (see for example 82 in FIG. 4).

The protruding portion of the stiffener 154 generally defines a space for the hook receivers 158 and the internal EMI gaskets 156, i.e., these elements are trapped between the stiffener 154 and the access door 152 when assembled. The hook receivers 158 are located proximate a corresponding number of passages 166 in the stiffener 154, and may be fitted into the passage 166. The hook receivers 158 generally form a slot that allows a retention hook to be placed therein (see for example 104 in FIG. 4). The hook receivers 158 also cooperate with the stiffener 154 to form a void that extends underneath the stiffener 154. The retention hooks when placed within the slotted hook receivers 158 can be slid into the void in order to form an interlocking connection. The EMI gasket 160 is configured to be positioned around the outer perimeter of the stiffener 154. In fact, the stiffener 154 may include a groove for receiving a portion of the EMI gasket 160. When positioned in the groove, the EMI gasket 160 is somewhat attached to the stiffener 154, i.e., retained within the groove. The Emi gasket 160 is configured to seal the interface between the stiffener and the housing (see for example 86 in FIG. 4).

The operation of the door system 68 will now be discussed in conjunction with FIGS. 6-8. FIGS. 6A-C illustrate the quick release latching mechanism 72 in the closed position (e.g., door secured). FIGS. 7A-B illustrate the quick release latching mechanism 72 in the opened position (e.g., door released).

In order to remove the access door 71 from the housing 70, a user simply rotates the handle 110 upwards. The rotating handle 110 pulls the slider bar 98 towards the handle 110. This is accomplished through the motion transform assembly (e.g., arms 118, pin 120, groove 122, protruding member 124). When pulled, the slider bar 98 slides relative to the support bar 82 via the shoulder bolts 100 and slots 102 disposed in the slider bar 98. The sliding slider bar 98 causes the retention hooks 104 to slide from the engagement position to the disengagement position. When slid from the engagement position to the disengagement position, the flange 108 moves along a tapered portion 170 of the hook receivers 158 thereby causing the retention hooks 104 to translate relative to the slider bar 98 under the force of the leaf spring 106. When in the disengagement position, the flanges 108 are decoupled from the hook receivers 158 and therefore the access door 14 may be pulled away from the housing, i.e., the flanges pass through opening in the hook receivers when pulled away.

In order to connect the access door 71 to the housing 70, the user rotates the handle 110 downwards. The rotating handle pushes the slider bar 98 away from the handle 110. This is accomplished through the motion transform assembly (e.g., arms 118, pin 120, groove 122, protruding member 124). When pushed, the slider bar 98 slides relative to the support bar 82 via the shoulder bolts 100 and slots 102 disposed in the slider bar 98. The sliding slider bar 98 causes the retention hooks 104 to slide from the disengagement position to the engagement position. When slid from the disengagement position to the engagement position, the flange 108 moves along a the tapered portion 170 of the hook receivers 158 thereby causing the retention hooks 104 to translate relative to the slider bar 98 against the force of the leaf spring 106 (e.g., the spring force pulls the door tight against the housing). When in the engagement position, the flanges 108 are coupled to the hook receivers 158 and therefore the access door 71 is secured to the housing 70.

In summary, the door system disclosed herein provides a structure for accomplishing a quick and efficient installation and removal of an access door to and from the computer. For example, it requires no tools and at least one hand to manipulate removal and installation. As discussed in the background, conventional doors have been attached to the housing of the computer with fasteners and often need to be pried out from the housing in order to be removed. This is time consuming and cumbersome process. Furthermore, it requires tools and more than one hand. Thus, those users without tools or those users with physical limitations may not be able to remove the door from the computer. The door system of the present invention overcomes these disadvantages.

In accordance with another aspect of the present invention, and referring back to FIG. 2, the computer 10 includes a modular fan assembly 170 that can be removed and installed into an interior portion of the computer 10 with simplicity and ease. By removing the modular fan assembly 170, the user can have greater access to other devices mounted in the computer 10. For example, the fan assembly 170 may block access to memory modules 172 such as DIMMs when disposed inside the computer 10, but allow access to the memory modules 172 when removed from the computer 10. The modularity of the fan assembly may also provide several competitive advantages such as ease of assembly and servicing.

The fan assembly 170 may be part of an overall heat transfer system configured to remove heat from heat producing elements housed within the computer 10. The heat producing elements may for example include IC chips. As is generally well known, IC chips such as those used for the main processors 36 generate heat and are therefore susceptible to overheating. Overheating may lead to errors in the functionality of the chip. The problem is compounded by the ever increasing speed of IC chips.

In the illustrated embodiment, the fan assembly 170 is a component of the heat transfer system that works to transfer heat away from the main processors 36 of the computer 10. The fan assembly 170 is configured to force air through one or more heat sinks 30. The heat sinks 30, which generally consist of a plurality of spatially separated fins, are thermally coupled to the main processors 36. In operation, the heat sinks 30 carry heat away from the main processors 36, and the air from the fan assembly 170 carries the heat away from the heat sinks 30. The fan assembly 170 essentially pulls air from the front side of the housing 12, and forces air to the back of the computer 10. As the air is forced through the computer 10, it passes over or through the fins of the heat sinks 30. The heat collected by the fins of the heat sinks 30 is then collected by the air and moved out of the computer 10 through air vents in the back of the housing 12. The heat transfer system may additionally include a corresponding fan assembly 170 at the rear of the housing to help move air out of the housing 12.

As shown in FIG. 2, the fan assembly 170, when inserted, is positioned within an interior portion of the computer housing 12. The interior portion may for example be a channel 174 defined by one or more components of the computer (e.g., housing walls, internal platforms or plates, circuit boards, etc.). In the illustrated embodiment, the channel 174 is formed by second shelf 20B, third shelf 20C, the mother board 32 (and/or the back side portion of the housing 12), the access frame 18 and the access door 14 when closed, and the front and rear portion of the housing 12. The channel 174 is generally configured to allow the distribution of air through the computer 10 so as to cool components located therein. For example, the channel 174 helps direct air from the fan assembly 170 through the heat sinks 30 located within the channel 174.

The fan assembly 170 is generally configured for sliding receipt in the interior portion of the housing 12 between a mounting position and a removal position. In the mounting position (as shown), the fan assembly 170 is mounted to the housing 12 or some internal structural component thereof (e.g., shelves 20B and 20C) and electrically coupled to the electrical circuitry (e.g., motherboard 32) of the computer 10. In the removal condition, the fan assembly 170 is removed from the housing 12 or some structural component and electrically decoupled from the electrical circuitry of the computer 10.

In order to facilitate this arrangement, the fan assembly 170 generally includes a mating feature 178 that slidably engages a mating portion 180 of the housing 12 or some element thereof in order to support and properly position the fan assembly 170 inside the computer 10. By way of example, the mating feature 178 may slidably engage one or more of the shelves 20 disposed inside the housing 12. The mating feature 178 and mating portion 180 may be widely varied, and may for example include catches, hooks, flanges, slots, guides, and the like. The fan assembly 170 also includes an electrical connector (not shown in FIG. 2) that is configured to electrically engage a corresponding electrical connector disposed within the interior portion (e.g., channel 174). When electrically connected, the fan assembly 170 can be controlled and powered by the computer 10. When electrically disconnected, the fan assembly 170 is no longer powered or controlled by the computer 10.

Figure 9A:
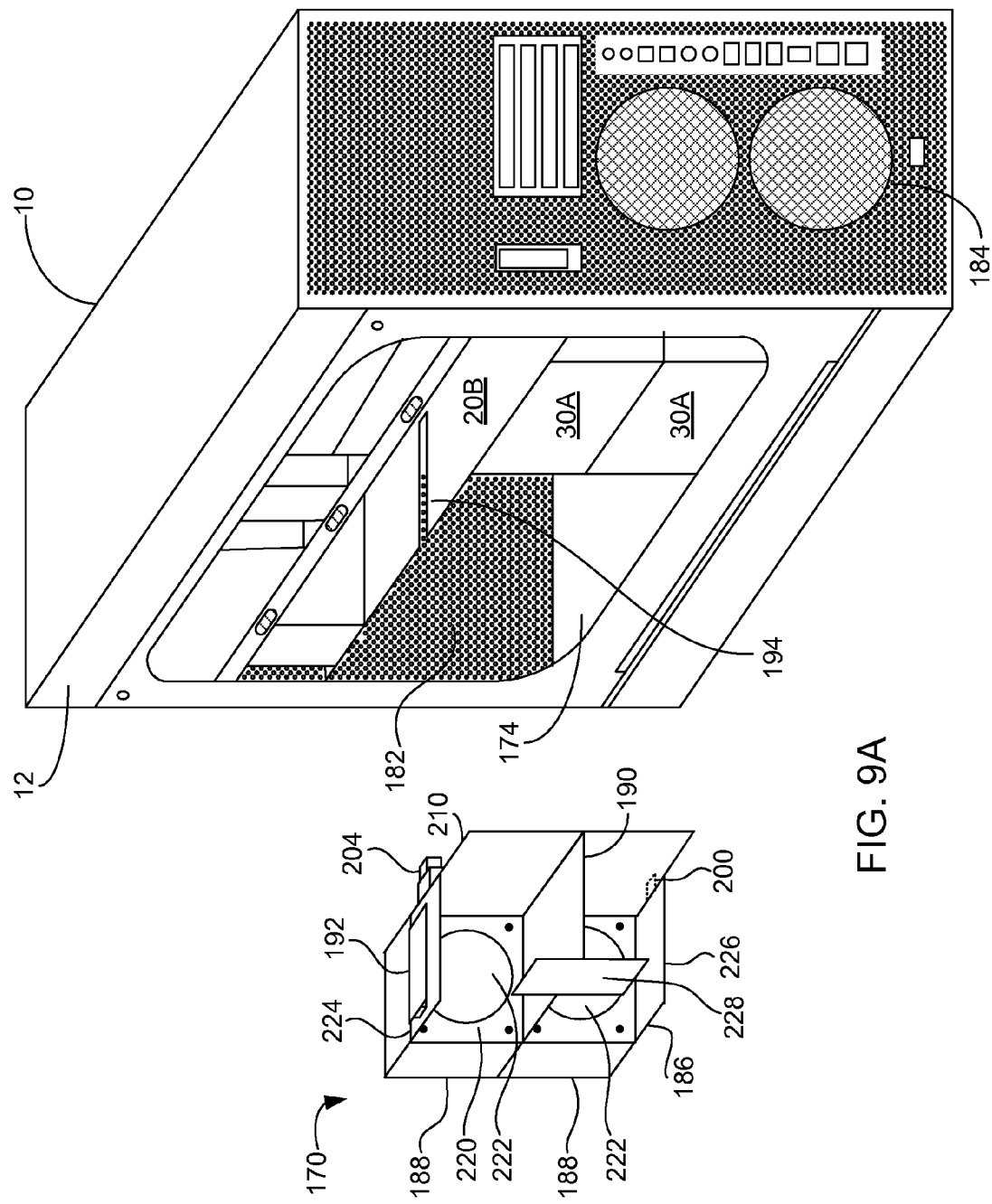
FIG. 9A is a perspective diagram of a computer with a removed fan assembly, in accordance with one embodiment of the present invention.
Figure 9B:
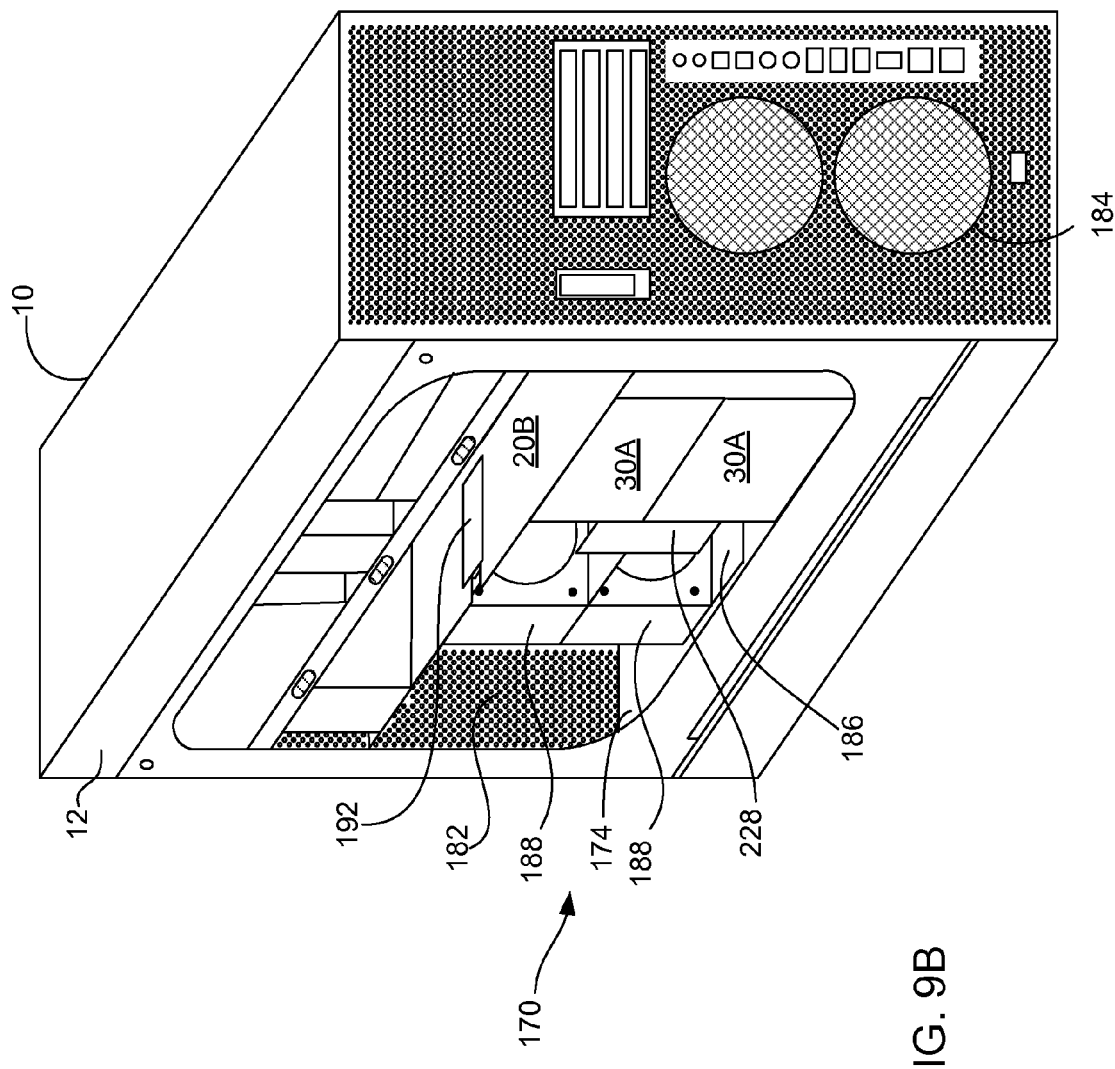
FIG. 9B is a perspective diagram of a computer with an inserted fan assembly, in accordance with one embodiment of the present invention.
Figure 10A:
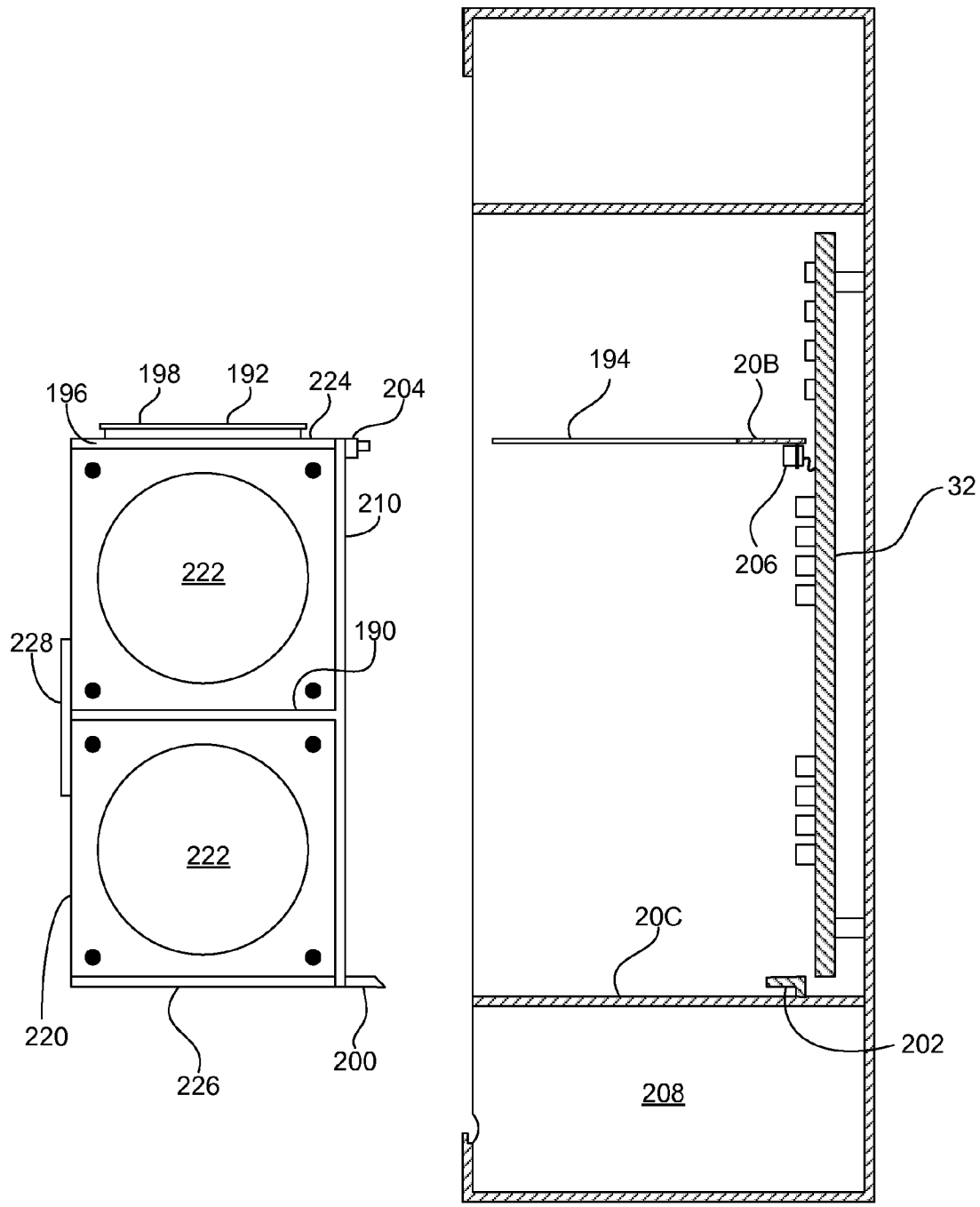
FIG. 10A is a side elevation view, in cross section, of a computer with a removed fan assembly, in accordance with one embodiment of the present invention.
Figure 10B:
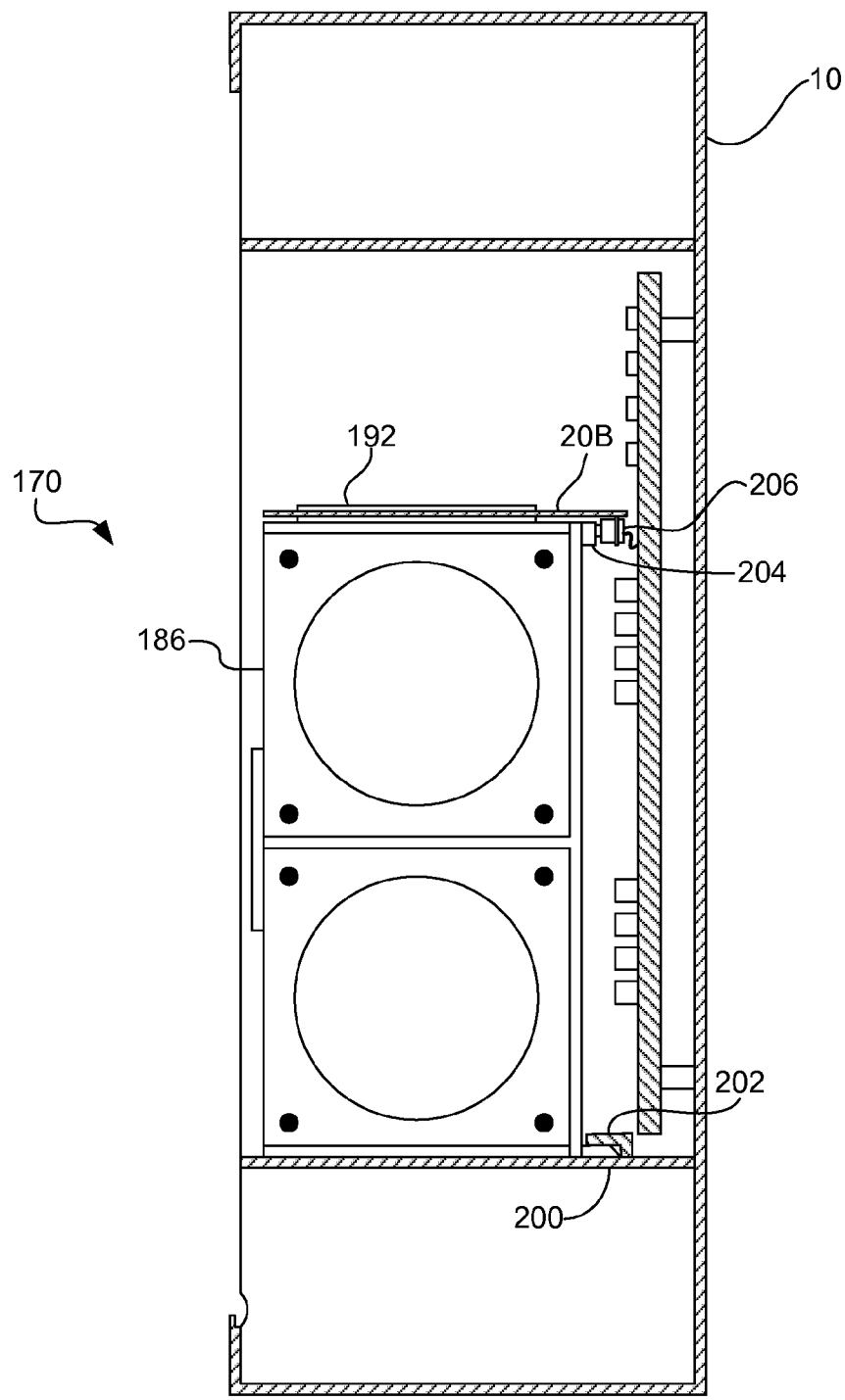
FIG. 10B is a side elevation view, in cross section, of a computer with an inserted fan assembly, in accordance with one embodiment of the present invention.
Figure 12:
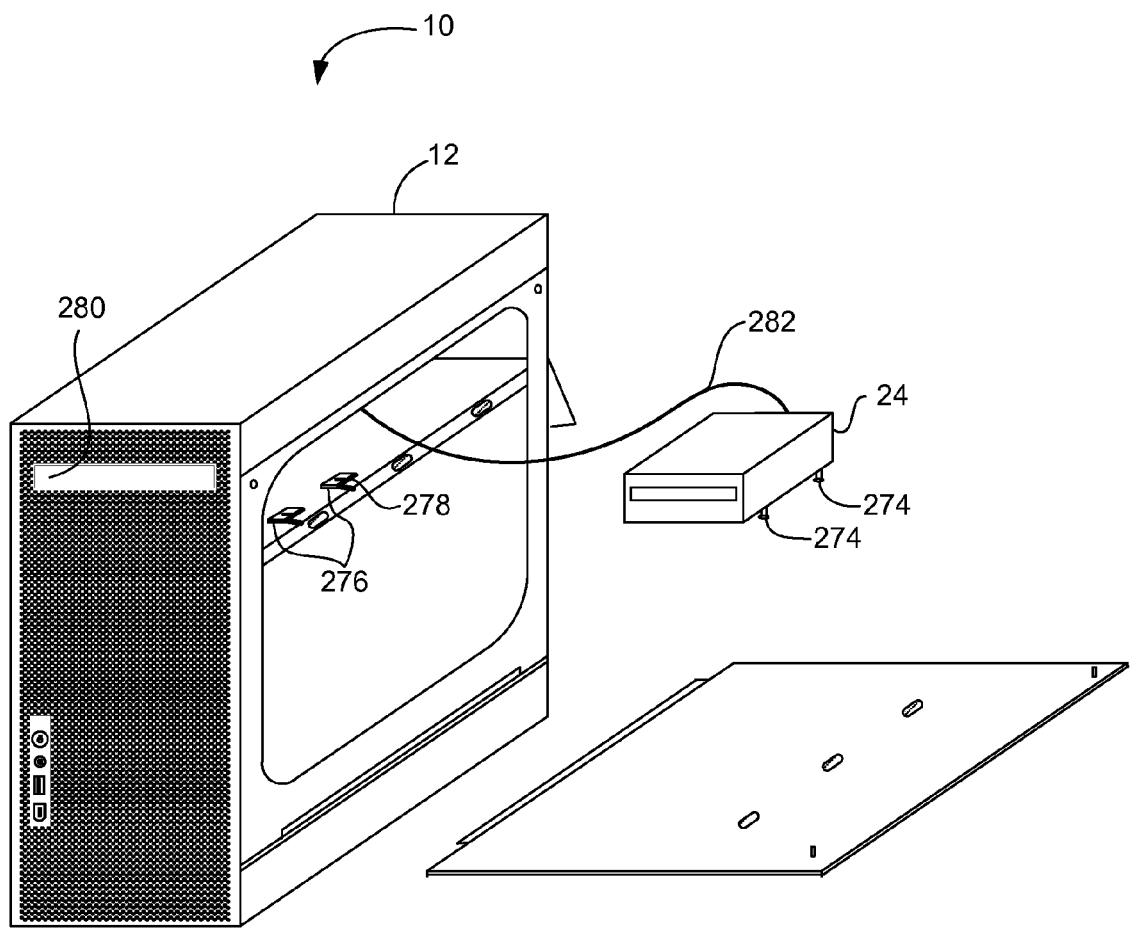
FIG. 12 is a perspective diagram of a computer with a disk drive removed, in accordance with one embodiment of the present invention.

Referring to FIGS. 9-10, the fan assembly 170 in accordance with one embodiment will be described in greater detail. The fan assembly 170 is generally configured to slide in and out of computer 10 while making all the necessary electrical and mechanical connections and disconnections to and from the computer 10. For example, the fan assembly 170 may be slid into the channel 174 located within the housing 12 of the computer 10 (as shown in FIGS. 9B and 10B), and the fan assembly 170 may be slid out of the channel 174 located within the housing 12 of the computer 10 (as shown in FIGS. 9A and 10A). When inserted, the fan assembly 170 is supported by the housing 12 in its proper position within the channel 174 and electrically connected to the computer 10 so that it can pull air from an intake 182 located at the front of the channel 174 and exhaust the air through a vent 184 located in the rear of the channel 174. When removed (as shown), the fan assembly 170 is no longer supported or electrically connected and thus a user can access components located within the channel 174 behind the fan assembly 170.

As shown, the fan assembly 170 includes a fan carrier 186 and one or more fans 188 attached thereto. The fan carrier 186 generally provides a structure for moving the fans 188 in and out of the computer 10, supporting and properly positioning the fans 188 within the computer 10 and for helping distribute the air from the fans 188 to the internal components of the computer 10. The number of fans may be widely varied. For example, single or multiple fans may be used. In most cases, there is a fan 188 for each heat sink 30 just like there is a heat sink for each processor 36. In the illustrated embodiment, the computer 10 includes a pair of heat sinks 30 and thus the fan assembly 170 includes a pair of fans 188 (one for each heat sink). Each of the fans 188 is configured to pull air from the front side of the housing 12 and to force air to the back of the computer 10 through its corresponding heat sink 30. In order to help distribute the air to the appropriate areas of the computer 10, the fan carrier 186 may include one or more dividers 190 that break the main air channel 174 into a plurality of sub air channels. The number of sub air channels generally depends on the number of fans 188 and heat sinks 30. In the illustrated embodiment, there are two sub air channels, one for each fan/heat sink grouping. The first channel helps direct air over the first heat sink 30 and the second channel helps force air over the second heat sink 30.

In order to facilitate the sliding action and the proper placement of the fans 188 within the channel 174, the fan carrier 186 generally provides a means by which the fan carrier 186 can be received by the housing 12 or some other element thereof (e.g., shelves 20). The means, for example, can be one or more mating features that are received by a corresponding mating portion within the housing 12. When received, the mating features also cooperate to align the fan carrier 186 relative to the heat sinks 30, i.e., they place the fans 188 in the proper position adjacent the heat sinks 30.

In the illustrated embodiment, the fan carrier 186 includes a T-flange 192 that mates with a corresponding slot 194 within the shelf 20B of the channel 174. The T-flange/slot interface allows the fan carrier 186 to be slidably received by the computer 10. The T-flange 192 generally includes a central member 196 and a top member 198. The central member 196 is dimensioned for sliding receipt within the slot 194, and the top member 198 is dimensioned to rest on the upper surface of the shelf 20B. This particular arrangement allows for sliding receipt of the fan carrier 186 as well as to position the fan carrier 186 in its proper position within the housing 12. For example, the top member/upper plate interface sets the z axis position while the central member/slot interface sets the x and y positions as well as rotation about the z axis.

In order to further hold the fan carrier 186 in place within the housing 12, the fan carrier 186 may include a tongue 200 that mates with a corresponding groove 202 located on the bottom plate (e.g., shelf 20B) of the channel 174. The tongue 200 is generally dimensioned for insertion within the groove 202. When inserted, the tongue/slot interface helps guide the fan carrier 186 into its proper position within the housing 12. For example, it may help set the fan carrier 186 along the x, y and z axis as well as to prevent rotation about x, y and z axis. In essence, the fan carrier 186 is retained within the housing 12 when the T-flange 192 and tongue 200 are placed within the slot 194 and groove 202.

The fan carrier 186 also includes a carrier connector 204 configured to both structurally and electrically engage or mate with a corresponding connector 206 located within the channel 174 when the carrier 186 is slid into the channel 174. The carrier connector 204 may for example be a plug while the corresponding connector 206 may for example be a socket (or vice versa). The carrier connector 204 generally provides electrical connection to both fans 188 while the corresponding connector 206 provides electrical connection to the motherboard 32 and/or the power supply located within a lower section 208 of the computer 10. This is generally accomplished through one or more wires.

As shown in FIG. 10B, these two connectors 204/206 are cooperatively positioned so that when the carrier 186 is placed within the channel 174, the two connectors 204 and 206 mate with one another thus electrically connecting the fans 188 to the electrical components of the computer 10. As long as they are cooperatively positioned, the connectors 204 and 206 can be placed almost anywhere along the carrier/channel interface. In some cases, the socket portion of the connector arrangement is configured to include a generous lead in for receiving the plug so that the connectors 204 and 206 may be easily engaged when the fan carrier 186 is slid into the channel 174. By way of example, the opening in the socket may include a taper or chamfer that guides the plug to the appropriate place within the opening in the socket. In the illustrated embodiment, the carrier connector 204 is mounted to a top portion of a side member 210 of the carrier 186, and the corresponding connector 206 is mounted to the bottom surface of the shelf 20B. More particularly, the carrier connector 204 is placed in line with the T flange 192 in front of the carrier 186 and the corresponding connector 206 is placed in line with the slot 194 at the end of the slot 194.

In one embodiment, one or both of the connectors 204 and 206 are configured to gimbal relative to structure to which they are mounted in order to correct any misalignment between connectors 204 and 206. By gimbal it is generally meant that the connectors are able to float in space relative to their respective structures while still being constrained thereto. The gimbal permits the connector to shift freely so that connectors can mate even when it would otherwise be misaligned, as for example, when the fan carrier 186 is improperly positioned in the channel 174. When a single connector gimbals, the position of the gimbaling connector conforms and adjusts to the position of the other connector. When both connectors gimbal, the position of both connectors conforms and adjusts relative to each other. The gimbal may allow single or multiple degrees of freedom. For example, movements in the x, y, and z directions and/or rotations about the x, y and z axis.

The gimbal may be provided in a variety of ways, including but not limited to one or more pivot joints, translating joints, flexure joints, rotational joints, ball and socket joints and the like. In one particular implementation, each of the connectors 204 and 206 is configured to gimbal. The gimbal of the carrier connector 204 is provided by play that exists between the housing of the carrier connector 204 and a carrier bracket 212 positioned on the fan carrier 186. The gimbal of the corresponding connector 206 is provided by play that exists between the housing of the corresponding connector 206 and a bracket 214 positioned on the upper plate (e.g., shelf 20A). Each of these implementations is discussed in greater detail below in FIGS. 11 and 12.

The fan carrier 186 may be held in place by a friction coupling. The friction coupling may be provided between the mating features/portions or the mating connectors. Additionally or alternatively, the friction coupling may be provided by additional mating structures of the fan carrier 186 and computer 10. One advantage of frictional couplings is that the fan carrier 186 is not locked or snapped in thus it may be easily pulled out and pushed into the computer 10, i.e., the fan carrier 186 simply slides in and slides out. In the illustrated embodiment, the fan carrier 186 is held in place by a friction coupling found between the surfaces of the mating connectors 204 and 206. In this embodiment, the plug connector fits snuggly into the socket connector so that a friction force holds the two connectors 204 and 206 together, i.e., resists sliding motion. In order to decouple the connectors 204 and 206, and thus the fan carrier 186 from the upper and lower plates, the friction between the mating surface of the connectors 204 and 206 needs to be overcome. Alternatively or additionally, the friction coupling may be found between the surfaces of the mating features 192 and 194.

The fan carrier 186 may be further held in place by the access door 14 or an inner door located between the access door 14 and the housing 12, as for example, in the case of a shock and vibration situation. Either of these doors can be configured to provide pressure against the fan carrier 186 when the door 14 is in the closed position. The pressure may be heavy to none as it may only need to keep the fan carrier 186 from sliding out of the computer 10. Although friction couplings are generally preferred for the ease of use, it should be noted that it is not a limitation and that locks, latches, snaps, flexures, detents, magnets and the like may also be used to help secure the fan carrier within the channel.

Referring to FIG. 9A, the fan carrier structure will be described in greater detail. As already mentioned, the fan carrier includes a divider 190 and a side member 210. The divider 190 separates the carrier 186 into multiple sub channels. The divider 190 is generally positioned between the two fans 188 so that one channel directs air to a first heat sink 30A and the other channel directs air to the second heat sink 30B. The side member 210, on the hand, generally provides structure to the fan carrier and may further provide a wall for ducting the air within the computer. The side member 210 may help duct air through the heat sinks 30 while covering a portion of the motherboard 32. The side member may be straight or sloped. The side member 210 additionally provides a structure to which the carrier connector 204, and tongue 200 are mounted.

Although not previously discussed, the fan carrier 186 also includes a front member 220, which provides a mounting surface for the fans 188. As shown, the fans 188 are positioned in front of their own opening 222 in the front member 220. Each opening 222 is located in a different sub channel. The openings 222 provide a passage for the air to travel from the fans 188 to the heat sinks 30. The fans 188 may be mounted to the front member 220 using any suitable means. The fans 188 may for example be mounted to the front member 220 via rubber grommets located at each corner of the fans 188. The rubber grommets are typically retained in through holes located in both the fan housing and the front member 220.

The fan carrier 186 also includes a top member 224 and a bottom member 226, which provide further structure to the fan carrier 188 and which provide a mounting surface for the mating features, particularly T-flange 192. The top and bottom members 224 and 226 may also further help duct the air through the computer 10. For example, they may help guide air to the heat sinks 30. The fan carrier 186 additionally includes a handle 228 for pulling the fan assembly out of the computer and for pushing the fan assembly into the computer. The handle 228 is generally placed at a location that can be easily grasped by the user. For example, the handle 228 may be located on the side of the fan carrier 186 closest to the removable access door 14 when the access door 14 is closed. The user, after removing the door, can therefore grasp the handle 228 and pull the fan assembly 170 out of the computer 10. In the embodiment shown, the handle 228 is connected to the divider 190.

The fan carrier 186 and its components may be assembled in a variety of ways. For example, each of the members may be attached to one another using conventional techniques such as fasteners, adhesives and the like and/or they may be integrally formed as a single unit. Furthermore, the fan carrier may be formed from a variety of materials including but not limited to plastic and metal. In the illustrated embodiment, the fan carrier is formed from a single piece of plastic (molded).

FIGS. 11A and 11B are perspective diagrams of a connection arrangement of the fan carrier 186 and the computer 10. As shown, the carrier 186 includes a bracket 232 for receiving the carrier connector 204 and the shelf 20B includes a bracket 234 for receiving the corresponding connector 206. Both brackets 232 and 234 are configured to allow their associated connectors 204 and 206 to float within the bracket 232 and 234 while keeping it constrained thereto (e.g., gimbal). As shown, the carrier connector 204 generally includes a body 236 that is positioned within a channel 238 formed by the carrier bracket 232 and a plug 240 that extends out an opening 242 in the carrier bracket 232. The wires 244 of the connector 204 go through another opening 246 in the bracket 232 and dive down to meet the fans. The body 236 is typically dimensioned to provide clearance all the way around thereby giving it some play within the channel 238 of the bracket 232. The clearance allows the connector 204 to float in the bracket 232. The connector 204 may freely sit in the bracket 232 or it may contain a means to hold it within the channel 238. For example, it may include a strap that goes over the top of the connector 204, or it may be held by a friction coupling as for example caused by the wires 244 pressed into the opening 246. In some cases, it may be desirable to prevent movement, and therefore crush ribs may be provided in the clearance to make the body 236 fit tight within the channel 238.

Furthermore, the corresponding connector 206 generally includes a body 250 that is positioned within a pair of arms 252 formed by the corresponding bracket 234. The body 250 is retained within the arms 252 by a flange portion 254 and flexible catches 256 on both sides of the body 250. The flexible catches 256 are configured to flex so as to allow placement of the body 250 within the arms 252. Once placed, the flexible catches 256 spring back thereby trapping the arms 252 between themselves and the flange portion 254. By way of example, the arms 252 may be formed by a piece of sheet metal that is bent down from the shelf 20B. Like the carrier connector 204, the body 250 of the corresponding connector 206 is dimensioned to provide clearance all the way around thereby giving it some play within the arms 252 of the bracket 234. The space between the flexible catch 256 and the flange portion 254 may also provide a clearance for allowing movement of the body 250. As above, the clearance allows the connector 206 to float in the bracket 234.

In one embodiment, because the connectors 204 and 206 are blind mate connectors, the body 250 of the corresponding connector 206 includes a lead in chamfer or taper 258 around its opening 260 to help guide the plug 240 of the carrier connector 204 therein. Once in place, the terminal of the connectors 204 and 206 are engaged and the fans are electrically coupled to the computer.

In summary, the fan assembly disclosed herein provides a structure for accomplishing a quick and efficient installation and removal of the fans to and from the computer. For example, it requires no tools and only one hand to manipulate removal and installation. As discussed in the background, conventional fans have been attached to the frame or chassis of the computer with screws, bolts or grommets. In order to remove the fans from the computer, it has been necessary to unfasten and remove each of the screws or grommets securing the fan to the frame or chassis. This is a time consuming and cumbersome process. Furthermore, it requires tools and more than one hand. Thus, those users without tools or those users with physical limitations may not be able to remove the fan from the computer. The fan assembly of the present invention overcomes these disadvantages.

In accordance with another aspect of the present invention, and referring back to FIG. 2, the computer 10 includes a disk drive 24 that can be removed and installed into an interior portion of the computer 10 with simplicity and ease. The removability of the disk drive 24 may provide several competitive advantages such as ease of assembly and servicing. The removability may also provide greater access to other devices mounted in the computer 10 and may provide interchangeability between other disk drives.

The disk drive 24 may be widely varied. By way of example, the disk drive may be an optical disc drive, floppy disk drive, zip drive, hard drive or the like. In the illustrated embodiment, the disk drive 24 corresponds to an optical drive and more particularly a CD/DVD drive capable of receiving compact disks (CD) and digital video disks (DVD). The CD/DVD drive generally includes drive components for reading CD's and/or a DVD's and transport components for inserting and removing the CD and DVD discs to and from the drive components. By way of example, the drive components may include a laser, light sensing diode, and a spindle motor, and the transport components may include a movable tray. The CD/DVD drive also generally includes an enclosure for housing the drive and transport components. The enclosure is typically arranged to structurally support the components, to shield electronic and laser emissions therein, and to prevent dust particles from reaching the drive components.

As shown in FIG. 2, the disk drive 24, when inserted, is positioned within an interior portion of the computer housing 12. The interior portion may for example be a channel 270 defined by one or more components of the computer. In the illustrated embodiment, the channel 270 is formed by the housing 12 and the first shelf 20A as well as the access frame 18 and the access door 14 when closed. The channel 270 may for example be a thermal zone capable of channeling airflow. In order to facilitate the insertion and removal of a disk to and from the disk drive 24, the housing 12 generally includes an opening that is cooperatively positioned relative to the disk drive 24. In some cases, the housing 12 may include a door for covering the opening in order to prevent particles from entering therethrough and for producing a continuous look at the periphery of the housing 12. The sliding tray of the disk drive 24 may be configured to push on the door in order to open the door and allow the tray to extend outside the housing 12. In one embodiment, the door is part of the door system 27 disposed between the housing 12 and the disk drive 24.

Referring to 12, the disk drive 24 is generally configured for sliding receipt in the interior portion 270 of the housing 12 between a mounting position and a removal position. In the mounting position (FIG. 2), the disk drive 24 is mounted to the housing 12 or some internal structural component thereof (e.g., shelves 20). In the removal condition (FIG. 12), the disk drive 24 is removed from the housing 12 or some structural component thereof. In order to facilitate the mounting and removal of the disk drive 24 to and from the computer 10, the computer/disk drive interface generally includes a quick release latching mechanism 272. The quick release latching mechanism 272 includes a drive-side mating feature that engages a computer-side mating feature inside the housing 12. The mating features may be widely varied, and may for example include catches, hooks, flanges, slots, guides, and the like. In the illustrated embodiment, the disk drive 24 includes posts 274 that can be inserted into post receivers 276 on the first shelf 20A of the computer 10.

The quick release latching mechanism 272 also includes one or more latches 278 that urge the drive-side mating feature into engagement and disengagement with the computer-side mating feature. When fully engaged, the mating features support and properly position the disk drive 24 inside the computer 10. For example, the mating features may place the disk drive 24 in its proper position relative to a disk door 280 on the housing 12. When fully disengaged, the disk drive 24 is placed in a position for removal. The latches 278 may also be configured lock the mating features in their engaged position thus securing the disk drive 24 to the housing 12 in a simple and easy manner. In one particular embodiment, the latches 278 are configured to trap the disk-side mating feature within the computer-side mating feature, i.e., the post 274 is trapped within the post receiver 276.

Furthermore, in order to electrically connect and disconnect the disk drive 24 to and from the computer 10, the disk drive 24 may include an electrical connector (not shown) that is configured to electrically engage a corresponding electrical connector (not shown) disposed within the interior portion of the housing 12. The corresponding electrically connector may for example be connected to the motherboard. When electrically connected, the disk drive 24 can be controlled and powered by the computer 10. When electrically disconnected, the disk drive 24 is no longer powered or controlled by the computer 10. In some cases, the disk drive 24 may be coupled to the computer 10 through blind mate connectors in a manner similar to the fan assembly 170, and in other cases, the disk drive 24 may be coupled to the computer 10 through a cable and conventional connectors. In the illustrated embodiment, a cable 282 allows the disk drive 24 to be removed and moved a substantial distance away from the computer 10. In other words, the disk drive 24 can be completely removed from the computer 10. If desired, the disk drive 24 can be completely decoupled from the computer 10 by disconnecting the cable 282 from the computer 10. The disconnection may for example occur by decoupling a connector at the end of the cable 282.

Figure 13A:
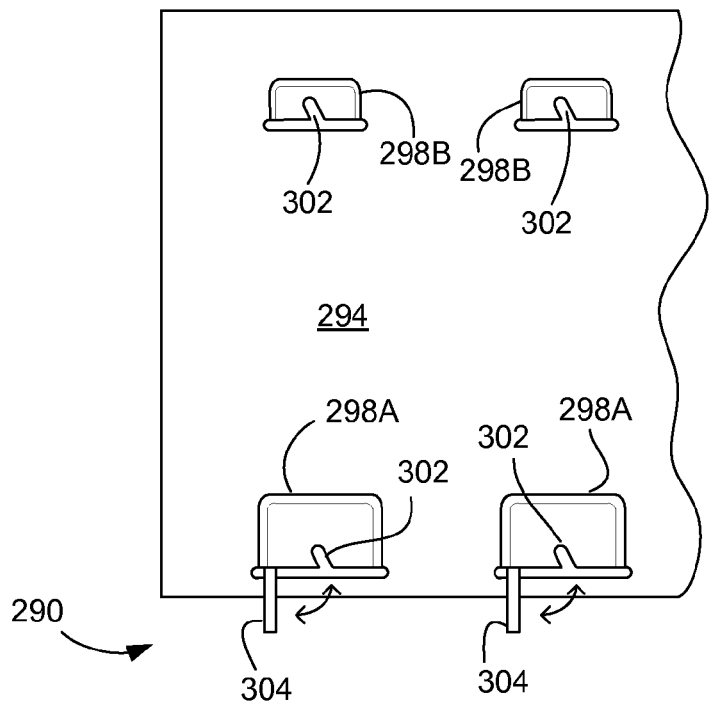
FIGS. 13A and 13B show a diagram of a disk drive mounting system, in accordance with one embodiment of the present invention.
Figure 13B:
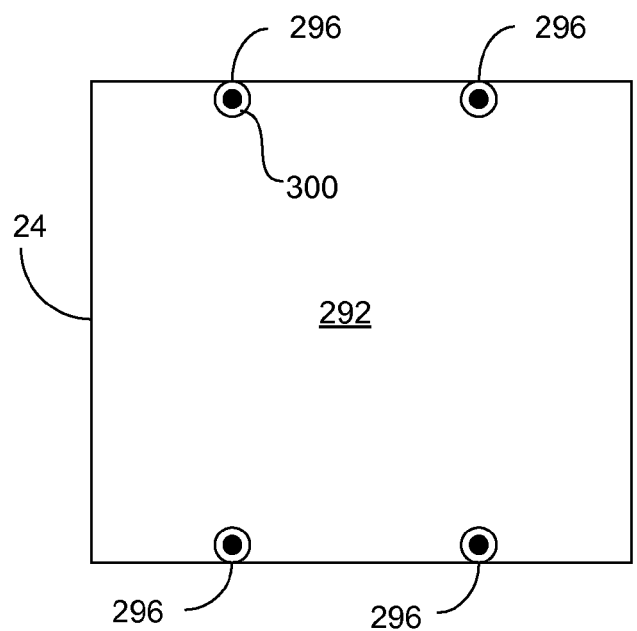

FIGS. 13A and 13B show a diagram of a disk drive mounting system 290, in accordance with one embodiment of the present invention. The disk drive mounting system 290 enables a user to easily and quickly secure and release the disk drive 24 to and from the housing 12. When installed, the disk drive 24 is at least positioned adjacent an opening or disk door in the housing so as to facilitate the placement and removal of a disk from the disk drive 24. When released, the disk drive 24 is presented to a user so that the user can remove the disk drive 24 from the computer 10. The disk drive mounting system 290 generally includes a disk drive plate 292, which may for example correspond to the bottom surface of the drive enclosure that houses the components of the disk drive 24. The drive mounting system 290 also includes a mounting plate 294, which may for example correspond to a shelf 20A inside the computer 10. The mounting plate 294 is configured to support the disk drive plate 292 and thus the disk drive 24 inside a computer 10.

The disk drive plate 292 includes a plurality of standoffs 296, each of which is capable of mating with a corresponding receiving bracket 298 on the mounting plate 294. The stand offs 296 are typically connected at standard mounting points. By way of example, the stand offs 296 may be secured to the disk drive plate 292 using screws or bolts that can be integrally connected with the stand off or separate components. In addition, the brackets 298 may be separate components that are attached to the mounting plate 294 as for example using some sort of fastener or they may be an integral part of the mounting plate 294 (e.g., molded part of the plate). In order to connect the stand offs 296 with the brackets 298, the standoffs 296 generally include a flange portion 300 that mates with a slot 302 on the bracket 298. The flange portion 300 may be slid into the slot 302 thus retaining it to the bracket 298. The slot 302 is generally designed to guide the disk drive via the standoff/slot interface into its appropriate position within the housing. The slots 302 may include an entry point and a final set point. The position of the brackets 298 generally depends on the position of the standoffs 296. In most cases, the mounting plate 294 includes a pair of front brackets 298A and a pair of rear brackets 298B. The front brackets 298A are position closer to the access door 14 in the computer 10 than the rear brackets 298B.

The disk drive mounting system 290 also includes a quick release latch system for positioning the standoffs 296 within the brackets 298 and lockably engaging the standoffs 296 relative to the brackets 298. By locking the standoffs 296 relative to the brackets 298, the disk drive 24 may be held in place inside the computer 10. The quick release latch system generally includes one or more rotatable latches 304 that cooperate with the brackets 298A to secure the standoffs 296 relative to the brackets 298A. By way of example, the latches 304 may be rotatably coupled to the brackets 298A via a shoulder bolt system that includes a shoulder bolt 305, which extends through a hole in the latch 304 and which is attached to the bracket 298A via a screw 306 (see FIG. 14). In the illustrated embodiment, only the front brackets 298A include a corresponding latch 304. This is done to make the latches 304 accessible to a user as for example when the access door is removed from the housing of the computer, i.e., the latches are generally placed at a location that can be easily grasped by the user.

Referring back to FIGS. 13A and 13B, the latches 304 are rotatable between a receiving position (shown) and a locking position. In the receiving position, the flange portion 300 of the standoff 296 is capable of engaging the slot 302 in the bracket 298. In the locking position, the flange portion 300 of the standoff 296 is captured within a space formed by the latch 304 and the bracket 298A. The flange portion 300 of the stand off 296 is essentially trapped between the latch 304 and the bracket 298A so that it cannot be removed (e.g., locked). The latches 304 may be operated independently (as shown) or they may operated together as a unit. For example, the latches 304 may be operatively coupled via a mechanical linkage that allows a user to operate a single lever in order to cause both latches 304 to rotate between the receiving and locking position.

Figure 14:
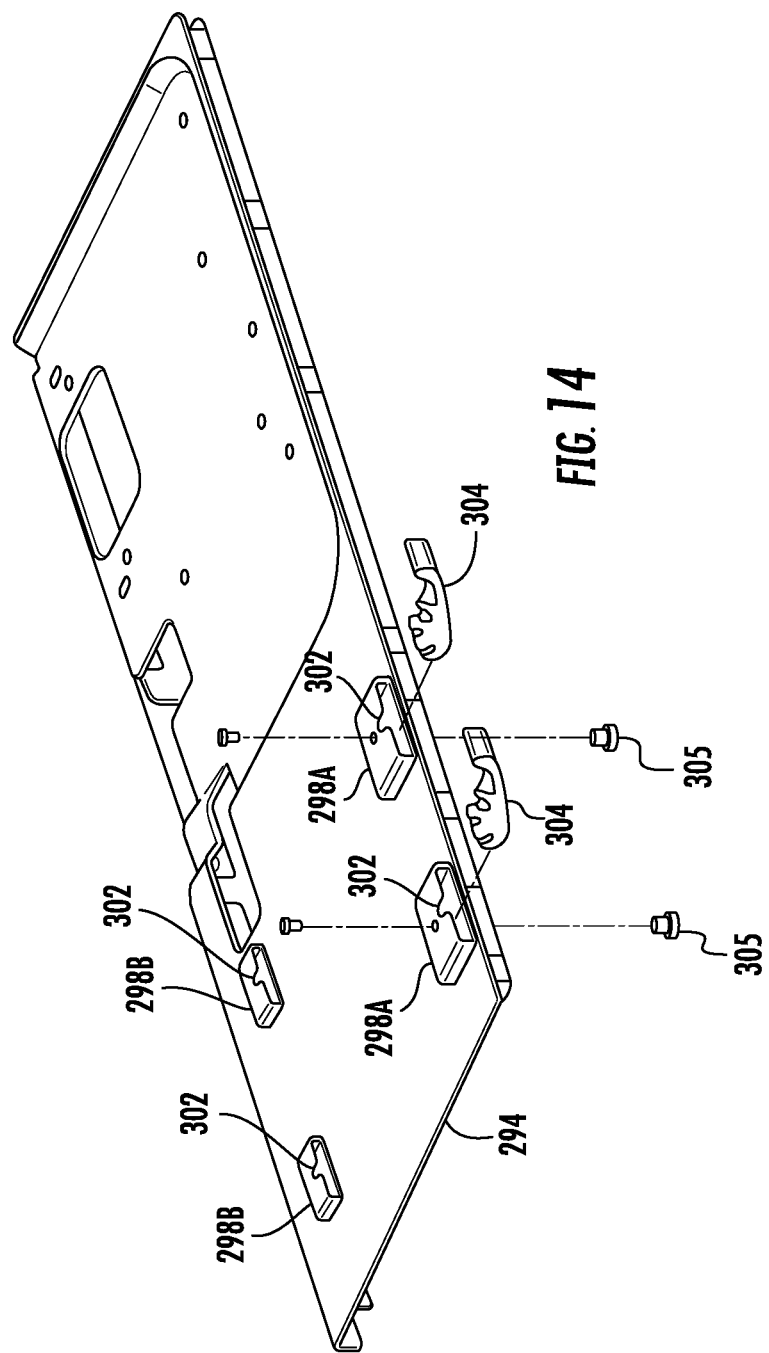
FIG. 14 is an assembly diagram of a disk drive mounting system, in accordance with one embodiment of the present invention.
Figure 15A:
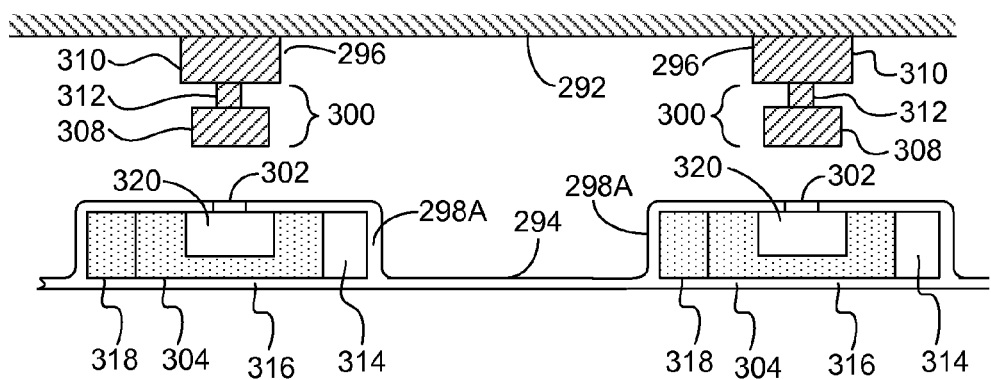
FIGS. 15A-C are side elevation views of the disk drive mounting system of FIG. 14.
Figure 15B:
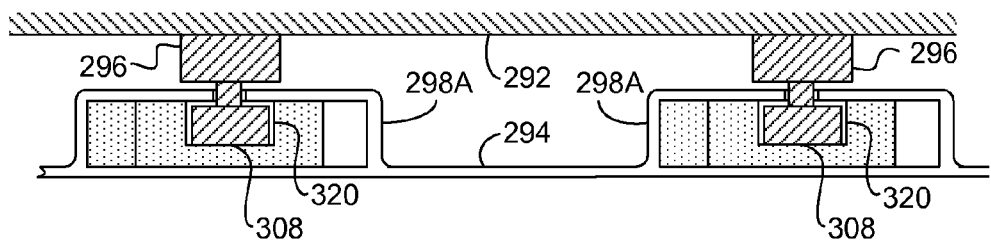
Figure 15C:
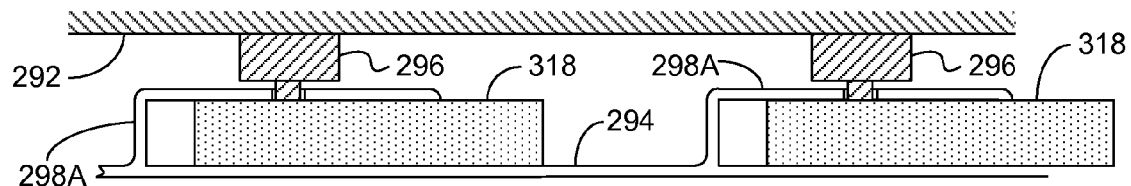

FIGS. 15A-C are side elevation views of the disk drive mounting system 290 of FIG. 14. These Figures illustrate a coupling sequence of the disk drive mounting system 290. As shown, the disk drive plate 292 includes standoffs 296 that are mounted to the bottom of the disk drive plate 292, and the mounting plate 294 includes brackets 298 that are integral with the mounting plate 294. The brackets 298 are configured to receive the standoffs 296. In particular, the brackets 298 include slots 302 that slidably receive a flange portion 300 of the standoffs 296. As shown, the standoffs 296 include a lower flange 308 and an upper flange 310, which are connected by a post 312. The diameter of the lower and upper flanges is larger than the diameter of the post 312 thereby forming a channel between the flanges 308 and 310. The post 312 is dimensioned for sliding receipt within the slot 302, and the top portion of the bracket 298 is dimension for sliding receipt within the channel formed by the upper and lower flanges 308 and 310. The slots 302 are generally configured to set the correct x and y positions for the disk drive 24. Although slidably interconnected, the standoffs 296 typically rest on the top surface of the bracket 298. The standoffs 296 are configured to set the correct z height for the disk drive 24. The standoffs 296 can come in various sizes depending on the dimension of the drive. For example, different drive manufacturers may require different standoffs.

The brackets 298 form a pocket 314 for receiving the latch 304 therein. The pocket 314 is configured to hide a substantial portion of the latch 304, as for example, a cam portion 316 of the latch 304. A lever arm 318 of the latch 304 is typically left exposed so that a user may easily actuate the latch 304. The latch 304 is rotatably coupled to a bracket 298 about an axis between a receiving position (FIG. 15B) and a locking position (FIG. 15C). In the receiving position, the lower flange 308 of the standoff 296 can be inserted into a groove 320 located within the cam portion 316 of the latch 304. In the locking position, the lower flange 308 of the standoff 296 is captured within the groove 320. The stand off 296 is essentially trapped between the latch 304 and the bracket 298 so that it cannot be removed (e.g., locked).

FIGS. 16A-C illustrate a sequence of movements as a disk drive is latched and unlatched, in accordance with one embodiment of the present invention. In each of these Figures, a latch 304 is used to install or release a disk drive from a shelf of a computer. When installed, the disk drive is at least positioned adjacent an opening or disk door in the housing so as to facilitate the placement and removal of a disk from the disk drive. When released, the disk drive is presented to a user so that the user can remove the disk drive from the computer. FIG. 16A shows the latch 304 in an open position for mating. FIG. 16B shows the latch 304 in a mated position. FIG. 16C shows the latch 304 in a mated and locked position.

Initially, the lower flange 308 of the stand-off 296 is placed in the receiving/presenting portion 324 of the groove 320 (FIG. 16A). The receiving/present portion helps guide the lower flange in and out of the groove 320. When the user first rotates the latch 304, as for example, via lever arm 318, the latch 304 captures the lower flange 308 within the groove 320. This action also causes the post 312 to move within the slot 302. Upon further rotation of the latch 304, the lower flange 308 is forced to move further within the groove 320 and the post 312 is forced to move further within the slot 302 (FIG. 16B). When the latch 304 is finally rotated, the lower flange 308 is positioned at the end of the groove 320 and the post 312 is positioned at the end of the slot 302 (FIG. 16C).

Because the bracket 298 is rigid, the standoff 296 and thus the disk drive are forced to follow a path defined by the slot 302. The path may be widely varied, but is generally configured to direct or guide the disk drive to its proper position within the computer. As shown, the slot 302 is angled and thus it includes multiple directional components. The first direction component guides the disk drive via the standoff 296 internal to the computer. The second directional component guides the disk drive via the standoff 296 towards the front of the computer. This particular path encourages proper placement of the disk drive relative to a disk opening or disk door in the front of the housing. For example, the end of the slot 302 may set the x and y position of the disk drive so that it is properly positioned next to the opening or disk door, i.e., the disk drive can be forced against the inner surface of the housing.

In summary, the removable disk drive system disclosed herein provides a structure for accomplishing a quick and efficient installation and removal of the disk drive to and from the computer. For example, it requires no tools and at least one hand to manipulate removal and installation. As discussed in the background, conventional disk drives have been attached to the frame or chassis of the computer with screws, bolts or grommets. In order to remove the disk drive from the computer, it has been necessary to unfasten and remove each of the screws securing the disk drive to the frame or chassis. This is time consuming and cumbersome process. Furthermore, it requires tools and more than one hand. Thus, those users without tools or those users with physical limitations may not be able to remove the disk drive from the computer. The disk drive assembly of the present invention overcomes these disadvantages.

In accordance with another aspect of the present invention, and referring to FIGS. 17A and 17B, a drive door 330 is provided that slides linearly up and down relative to the computer housing 12 between an opened and closed position. When opened, the drive door 330 is placed away from an opening 332 in the housing 12 in order to allow access to a CD/DVD disk drive located within the computer housing 12. This may for example, allow a disk tray 334 to move in and out of the computer housing 12 (FIG. 17B). When closed, the drive door 330 covers the opening 332 in order to prevent access therethrough and to protect and hide the internal components (CD/DVD drive) disposed within the housing 12 (FIG. 17A). In most cases, the drive door 330 is fully contained within the housing 12 (as shown by dotted lines), i.e., the drive door 330 slides internal and within the outer periphery of the computer housing 12. The sliding door 330 therefore does not increase the profile of the computer housing 12 like conventional rotating doors. As should be appreciated, rotating doors and their components (hinges) are often considered to be aesthetically non-pleasing since they protrude from the housing (especially in the open position).

The sliding door 330 may be slidably coupled to the housing 12 using one or more tracks, channels, and the like. The sliding action of the door 330 may be initiated via an actuator configured to drive the sliding door 330 linearly up and/or down between its open and closed positions. The actuator, which is located within the housing 12, typically includes a drive mechanism such as a motor. The drive mechanism may drive the door 330 directly or indirectly as for example through a drive transfer mechanism such as a push arm. The actuator may be controlled by the computer 10, i.e., the computer 10 informs the actuator when to drive the door 330 up and when to drive the door 330 down. In some cases, the door 330 may be spring biased in the closed position, and thus the actuator works against the spring bias in order to place the door 330 in the opened position.

In the illustrated embodiment, the actuator corresponds to the disk tray 334 of the disk drive. The disk tray 334, which is moved by a linear motor, pushes on the inner portion of the door 330 thereby causing the door 330 to slide down as the tray 334 extends outside the housing 12, i.e., the force from the sliding tray 334 as it exits the housing 12 forces the sliding door 330 to its opened position. Because the linear motions of the tray 334 and door 330 are perpendicular to one another, a means for transforming the linear motion of the tray 334 to the linear motion of the door 330 may be needed. The means may, for example, include an assemblage of motion mechanisms (e.g., linkages, cams, gears, chains, belts and the like), interconnected in such a way as to provide a controlled linear output motion in response to the supplied linear input motion. In one particular implementation, the linear motion of the tray 334 is transformed to rotary motion, and the rotary motion is transformed to the linear motion of the door 330. This particular implementation is described in greater detail below.

The sliding door 330 may be part of a door system that is mounted to the housing 12 or structural component thereof adjacent an opening 332 in the housing 12. The door system generally includes a door housing, which slidably supports the sliding door 330. The door housing may be attached to the computer housing 12 using any conventional means, i.e., fasteners, adhesives, snaps, etc. In one implementation, the computer housing includes a bracket for receiving the door housing. The bracket may include one or more slots, which accept flexure tabs located on the door housing. By forcing the tabs into the slots, the door housing may be snapped into its proper position within the bracket. In this manner, fasteners are not needed thereby enabling quick and easy assembly and disassembly.

FIGS. 18A and 18B are side elevation views of a disk drive system 350, in accordance with one embodiment of the present invention. The disk drive system 350 includes a disk drive 352, a housing 354 and a drive door assembly 356. The disk drive 352 may for example correspond to a CD/DVD drive, which includes a carrier tray 358 for carrying a disk to and from the disk drive 352. The carrier tray 358 is configured to translate between a closed position (FIG. 18A) and an open position (FIG. 18B). When closed, the carrier tray 358 is positioned within an enclosure 360 of the disk drive 352 so that a disk can be processed by the disk drive 352. When opened, the carrier tray 358 is positioned outside of the enclosure 360 of the disk drive 352 so that a user can insert or remove a disk from the carrier tray 358.

The housing 354 is configured to enclose the disk drive 352 and drive door assembly 356. The housing 354 may for example correspond to a computer housing such as computer housing 12 shown in the previous Figures. Alternatively, the housing 354 may be a drive housing, rather than a computer housing. In either case, the housing 354 includes an opening 362 for allowing the carrier tray 358 to extend out of the housing 354. The housing 354 is also configured to support these components in their assembled position within the housing 354. By way of example, the disk drive may be supported by a shelf inside the housing. Furthermore, the disk drive 352 may be attached to the housing 354 or some component thereof using fasteners or a quick release latching mechanism.

The drive door assembly 356 is positioned between the housing 354 and the disk drive 352. The drive door includes a frame 364, a sliding door 366, and a motion transformer 368. The frame 364 is configured to support the sliding door 366 relative to the motion transformer 368. The frame 364 may be attached to the housing 354 or the disk drive 352. In either case, the drive assembly 356 is generally positioned at a precise location relative to each in order to align the opening 362, sliding door 366 and carrier tray 358. The sliding door 366 is positioned as close as possible to the interior surface of the housing 354 so as to reduce gaps at the door/housing interface when the door 366 is closed while still allowing enough space for allowing movement of the door 366. The sliding door 366 is configured to slide relative to the frame 364. Although not shown, the sliding door 366 may include hooks that engage rails on the frame 364 thereby allowing the door 366 to slide relative to the frame 364. The sliding action allows the door 366 to move between a closed position where the door 366 is placed in front of the opening 362 to prevent access therethrough (FIG. 18A), and an opened position where the door 366 is placed away from the opening 362 to allow access therethrough (FIG. 18B). In FIG. 18A, the sliding door 366 is moved in front of the opening 362 thus hiding the opening and the internal components of the housing from view. In FIG. 18B, the sliding door 366 is moved away from the opening 362 so that the movable tray 358 can move out of the housing 354.

The motion transformer 368 is configured to transfer the linear motion of the carrier tray 358 to linear motion of the sliding door 366. The motion transformer 368 may be widely varied. In the illustrated embodiment, the motion transformer 368 includes a cam 370 that rotates relative to the frame 364 about an axis. The cam 370 may be pivotally coupled to the frame 364 via a pivot pin or other similar method. The cam 370 is configured to rotate between a first position and a second position. During operation, the linear motion of the carrier tray 358 is transformed into rotary motion at the cam 370 and the rotary motion of the cam 370 is transformed to linear motion at the sliding door 366. The cam 370 generally includes a ramp portion 372 for interfacing with the disk tray 358 and a gear portion 374 for interfacing with a corresponding gear portion 376 on the sliding door 366 (e.g., rack and pinion). Each of the gear portions 374 and 376 includes one or more teeth. The ramp 372 is configured to receive the carrier tray 358 in order to rotate the cam 370. The gear portion 374 is configured to mate the corresponding gear portion 376 on the sliding door 366 in order to move the sliding door 366 linearly downwards.

When a user desires the disk drive 352 to be open, the carrier tray 358 is caused to extend outside the housing 354 in a first linear direction 380. During its linear motion, the disk tray 358 pushes on the ramp 372 of the cam 370 thereby causing the cam 370 to rotate about it axis. During rotation, the contacting point between the ramp 372 and the carrier tray 358 may change from the front of the carrier tray 358 to the bottom of the carrier tray 358. In essence, the carrier tray 358 causes the cam 370 to roll around its axis. When the cam 370 rotates, the teeth located thereon engage the corresponding teeth located on the sliding door 366. As the cam 370 further rotates, each tooth engages another tooth thereby driving the sliding door 366 in a second linear direction 382, which is perpendicular to the first linear direction 380. In some cases, the cam 370 is spring biased in the first position so as to place the door 366 in its closed position when the carrier tray 358 is positioned within the disk drive 352, i.e., the spring forces the cam into the first position, and the cam via the gear portions forces the door in its closed position.

FIGS. 19A-19E are assembly diagrams of a drive door assembly 400, in accordance with one embodiment of the present invention. By way of example, the drive door assembly 400 may generally correspond to the drive door assembly described in FIG. 18 and may be placed between the disk drive and front housing adjacent an opening in the housing as shown in FIGS. 1-2 (element 27). In this embodiment, the drive door assembly 400 is capable of being attached to an inner surface of the front housing. In fact, the drive door assembly 400 may be snapped into a mounting portion located on the inner surface of the front housing in order to make assembly and disassembly easier (e.g., tool-less).

As shown in FIG. 19B, the drive door assembly 400 includes a shutter door 402, a shutter housing 404, a pivot gear 406 and an EMI shutter can 408. The housing 404 serves as a base for assembling all the components of the drive door assembly 400. The shutter door 402 includes a cosmetic shutter door 402A that is attached to a structural shutter door 402B via a tape member 402C. The cosmetic shutter door 402A provides a clean look that matches the exterior of the housing to which the drive door assembly 400 is positioned. The structural shutter door 402B provides the structural base of the door 402.

The structural shutter door 402B is slidably received by the shutter housing 404. This is accomplished through rails 410 positioned at the ends of the structural door 402B and a pair of tracks 412 positioned on the shutter housing 404. The rails 410 are configured to hook onto the tracks 412 so that they are slidably retained thereon. By way of example, the rails 410 may be inserted at the bottom of the tracks 412.

The shutter housing 404 also rotatably receives the pivot gear 406. This is accomplished through a pair of mounting posts 414 located on the shutter housing 404 and a pair of corresponding mounting posts 416 located on the pivot gear 406 that are rotatably connected via a pair of pivot pins 418. The pivot pins 418 may for example be placed through holes located in the mounting posts 416 and 418 and additionally in the side walls of the shutter housing 404. The pivot gear 406 includes a pair of ramps 420 for receiving a carrier tray of a CD/DVD drive. When engaged, the carrier tray pushes on the ramps 420 thus causing the pivot gear 406 to rotate via the mounting post interface.

The pivot gear 406 also includes a pair of gears 422 also located at each end of the pivot gear 406. The gears 422 are configured to mate with corresponding gears 424 located on the interior surface of the structural door 402B (e.g. rack and pinion). When mated, the teeth of the gears 422 and 424 engage thus causing the structural door 402B to slide along the shutter housing 404 via the rail/track interface. The pivot gear 406 may be spring biased by a pair of torsion springs 426, i.e., one at each mounting post interface. The torsion springs 426 generally bias the pivot gear 406 in a position that places the door 402 in a closed position. During an opening operation, the carrier tray works against the spring force when rotating the pivot gear 406. During a closing operation, the spring force causes the door 402 to move to the closed position when the tray is moved back into the disk drive.

The EMI can 408 is positioned over the shutter housing 404 in order to shield electronic emissions emanating in regions around the disk drive. The EMI can 408 is retained on the shutter housing 404 via a pair of tabs 428 located on the shutter housing 404 and a pair of slots 430 located on the EMI can 408. The EMI can 408 snaps onto the shutter housing 404 when the slots 430 are placed over the tabs 428. The EMI can 408 also includes a plurality of tabs 432 for engaging slots (not shown) located on the interior surface of the front housing. When engaged, the drive door assembly 400 is retained to the housing in its proper position. In order to allow some tolerance, the EMI can 408 may gimbal relative to the shutter housing 404. This may be accomplished by allowing some play at the tab/slot interface and a wireform 434 disposed between the shutter housing 404 and the EMI can 408. The wireform 434 provides some spring bias between the shutter housing 404 and the EMI can 408. The shutter housing 404 may include one or more nubs 436 for properly placing the drive door assembly 400 relative to the housing in which it is assembled.

In accordance with another aspect of the present invention, and referring back to FIG. 2, the computer 10 includes a hard drive 26 that can be removed and installed into an interior portion of the computer 10 with simplicity and ease. The removability of the hard drive 26 may provide several competitive advantages such as ease of assembly and servicing. The removability may also provide greater access to other devices mounted in the computer 10 and may provide interchangeability between other hard drives.

As shown in FIG. 2, the hard drive 26, when inserted, is positioned within an interior portion of the computer housing 12. The interior portion may for example be channel 270. The hard drive 26 is generally configured for sliding receipt in the interior portion 270 of the housing 12 between a mounting position and a removal position. In the mounting position (FIG. 2), the hard drive 26 is mounted to the housing 12 or some internal structural component thereof (e.g., shelves 20). In the removal condition (not shown), the hard drive 26 is removed from the housing 12 or some structural component thereof.

In order to facilitate the mounting and removal of the hard drive 26 to and from the computer 10, the computer/hard drive interface generally includes a quick release retention mechanism. The quick release retention mechanism 445 includes a drive-side mating feature that engages a computer-side mating feature inside the housing 12. The mating features may be widely varied, and may for example include nubs, grooves, channels, catches, hooks, flanges, slots, guides, and the like. In order to secure the mating features and thus the hard drive to the computer, the mating features may be configured as friction couplings. The quick release retention mechanism may also include a locking mechanism capable of locking the mating features in their engaged position. The locking mechanism may be widely varied and may for example include snaps, flexures, latches and the like. The quick release retention mechanism may also include one or more latches capable of urging the drive-side mating feature into engagement and disengagement with the computer-side mating feature.

Furthermore, in order to electrically connect and disconnect the hard drive 26 to and from the computer 10, the hard drive 26 may include an electrical connector (not shown) that is configured to electrically engage a corresponding electrical connector (not shown) disposed within the interior portion of the housing 12. The corresponding electrically connector may for example be connected to the motherboard. When electrically connected, the hard drive 26 can be controlled and powered by the computer 10. When electrically disconnected, the hard drive 26 is no longer powered or controlled by the computer 10. In some cases, the hard drive 26 may be coupled to the computer 10 through blind mate connectors in a manner similar to the fan assembly 170, and in other cases, the hard drive 26 may be coupled to the computer 10 through a cable and conventional connectors.

FIGS. 20A and 20B are diagrams of a hard drive mounting system 450, in accordance with one embodiment of the present invention. The hard drive mounting system 450 enables a user to easily and quickly secure and release one or more hard drives 26 to and from a computer. The hard drive mounting system 450 generally includes one or more hard drives 452, which may for example correspond to hard drive 26. The hard drive mounting system 450 also includes a rack system 454 for supporting and storing the hard drives 452 in an organized manner within the computer. The rack system 454 may for example be fixed to the shelf 20A located inside the housing 12 of computer 10. The rack system 454 is generally configured to hold the hard drives 452 in a stacked arrangement thereby using available space more efficiently. For example, the hard drives 452 may be stored in a parallel relationship. As shown, the rack system 454 includes one or more drive bays 456 for receiving an individual hard drive 452. Any number of drive bays 456 may be used. As should be appreciated, as the number of drive bays 456 increases so does the expansion capability of the computer. In the illustrated embodiment, the rack system 454 includes a pair of drive bays 456, particularly an upper drive bay 456A and a lower drive bay 456B.

The connection between the hard drives 452 and rack system 454 is preferably arranged to allow insertion and removal of the hard drives 452 with minimal effort and without tools, i.e., quick release coupling. The connection may be widely varied. In the illustrated embodiment, the hard drives 452 are slidably received by the rack system 454. The hard drives 452 are therefore capable of sliding in and out of the rack system 454. As shown, the hard drive 452 includes mounts 458 that slide into mating channels 460 in the rack system 454. The mounts 458 are generally positioned on opposing sides of the drive 452 and the mating channels 460 are generally located on opposing sides of the rack system 454 thereby allowing the hard drive 452 to be easily pushed in and pulled out of the rack system 454. The mounts 458 may for example be placed at standard mounting locations on the enclosure of the hard drive 452. Any number of mounts 458 may be used, although it has been found that four mounts work well (two on each side). The mounts 458 generally include a nub 459 dimensioned for sliding receipt within the groove 461 of the channel 460 (e.g., hemisphere, and inverse hemisphere). The nub 459 is typically connected to the enclosure of the hard drive 452 via a screw or bolt although other attachment means may be used. Furthermore, the nub 459 may be formed from a compliant material that is capable compensating for undesirable forces that may be inflicted on the hard drive 452 when it is mounted in the rack system 454.

The channels 460 generally guide the hard drive 452 to its proper position within the rack system 454. The channels 460 generally include an entry point 462 and a final point 464. The entry point 462 represents the area of the channel 460 that initially receives the mounts 458. In order to facilitate the easy placement of the mounts 458 in the channels 460, the entry point 462 may be flared outwards. The final point 464, on the other hand represents the area of the channel 460 that prevents further sliding movement. The final point 464 may for example set the final mount position of the hard drive 452 within the rack system 454. The final point 464 may for example correspond to an abutment stop. In the illustrated embodiment, a first set of channels is configured to guide a hard drive 452 to the lower bay 456B and a second set of channels is configured to guide a hard drive 452 to the upper bay 456A. As shown, the first set of channels includes a pair of continuous and parallel channels 460A, which receive both the front mounts 458A and rear mounts 458B of the hard drive 452. The second set of channels, on the other hand, includes a pair of first channels 460B and a pair of second channels 460C. The first channels 460B are configured to receive the rear mounts 458B and the second channels 460C are configured to receive the front mounts 458A. The first channels 460B include a front portion 466, a slope portion 468 and a rear portion 470. The front portion 466 is located underneath the second channels 460C and is generally configured for initially receiving the rear mounts 458B. The sloped portion 468 is configured to guide the rear mounts 458B to the rear portion 470, which is level with the second channels 460C.

In order to prevent the hard drives 452 from sliding out of the drive bays 456, the hard drive mounting system 450 may include one or more quick release mechanisms. For example, the hard drive mounting system 450 may include a friction coupling between surfaces of the mounts 458 and the channels 460, and more particularly, between the nub 459 and the groove 461. Alternatively or additionally, the hard drive mounting system 450 may include a holding detent for holding the mounts 458 in their desired position within the channel 460. The holding detent may for example be located near the entry point of the channel 460. The holding detent is typically designed to provide limited holding power. For example, enough holding power to maintain the proper placement of the mounts 458 within the channels 460 while still allowing a user to overcome it when pulling or pushing the hard drive 452 into and out of the drive bays 456 (e.g., one handed operation). Alternatively or additionally, the hard drive mounting system 450 may include quick acting clamps or latches that impede the sliding actions altogether.

The embodiment shown in FIG. 20 includes all three quick release mechanisms. For example, the drive mounting system 450 includes a holding detent in the form of locking flexures 472. The locking flexures 472 are generally configured to help retain the mounts 458 within the channels 460, and to help place the mounts 458 in their desired position within the channels 460 (and thus the hard drive 452 within the drive bay 456). The locking flexures 472 are located within each of the channels 460 and are generally positioned proximate the entry point. This enables them to cooperate with an abutment stop at the final point in order to hold the hard drive 452 in place within the drive bay 456, i.e., the rear mount 458B is pressed up against the abutment stop and the front mount 458A is pressed against the locking flexure 472. The locking flexure 472 generally includes a flexible body 474 connected to the rack system 450 and a locking tab 476 at its end. The locking tab 476 extends into the groove of the channel 460. The locking tab 476 serves as a temporary abutment stop.

As the drive 452 is pushed into the drive bay 456, the mounts 458 engage the channels 460 and thus the locking flexures 472. Because the locking flexures 472 flex, they allow the mounts 458 to pass when pushed in by a user. Once the mounts 458 have passed over them, the locking flexures 472 resume their natural position thereby trapping the mounts 458 in the channel 460 between the locking tab 476 and the abutment stop at the end of the channel 460. Using this arrangement, the hard drive 452 is prevented from sliding out of the bay 456 on its own. In order to remove the drive 452, a user simply pulls on the hard drive 452. During the pulling action, the mounts 458 slide within the channel 460 until they engage the lock flexures 472. When a significant pulling force has been provided, the locking flexures 472 flex thereby releasing the mounts 458 from the channel 460. Using this arrangement, the user simply has to overcome the spring bias at the locking flexure 472 when sliding the hard drive 452 in and out of the drive bay 456.

In order to further hold the drives 452 in place within the drive bays 456, the rack system 454 may include one or more user actuated latches 480. In general, there is latch 480 for each drive bay 456. The user actuated latches 480 are preferably placed towards the front of the rack system 454 so that they are easily accessible when the rack system 454 is mounted within a computer, i.e., the latches 480 are placed at a location that can be easily grasped by the user. The latches 480 are rotatable between a receiving position (vertical) and a locking position (horizontal). In the receiving position, the hard drive 452 can be placed within the drive bay 456, i.e., the mounts 458 are capable of engaging the channels 460 so that the hard drive 452 can be pushed into place. In the locking position, the drives 452 are captured within the drive bay 456 by the latch 480. The latch 480 serves as an abutment stop to the hard drive 452 in order to keep it from sliding out of the drive bay 456.

In addition to the above, the rack system 454 generally includes a mounting pedestal 484, which serves as a support structure for the rack system 454. The mounting pedestal 484 may be attached to a shelf inside the computer using any suitable means as for example screws or bolts. The mounting pedestal 484 may include one or more recesses 486 for receiving one or more cable as for example a cable from the motherboard located behind the rack system 454. The cables may for example include connectors at their end that engage corresponding connectors 488 on the front face of the hard drive 452 when the hard drive 452 is placed within the drive bay 456.

It is contemplated that the different embodiments of the present invention may be adapted for any of a number of suitable and known personal computers that process, send, retrieve and/or store data. For example, the personal computers may correspond to an IBM compatible computer or an Apple compatible computer. Further, the personal computer may generally relate to desktop computers, whether segmented or all-in-one machines, which sit on desks, floors or other surfaces. By way of example, the Apple compatible computer may correspond to different models including but not limited to iMac, eMac, Cube, G3, G4, G5 models, which are manufactured by Apple Inc. of Cupertino, Calif.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A computer, comprising:
   a housing having an interior portion and an access opening;
   a quick release access door configured to cover the access opening when the access door is in a closed position and to be tool-lessly placed in and removed from the access opening; and
   a quick release removable fan module that slides in and out of the interior portion of the housing through the access opening, the fan module making tool-less electrical and mechanical connections with the computer when the fan module is slid into the housing, the fan module making tool-less electrical and mechanical disconnections with the computer when the fan module is slid out of the housing, wherein at least one of the electrical connections is made by a gimbaling electrical connector configured to float relative to a structure to which it is mounted, wherein the gimbaling electrical connector is a friction coupling comprising a first blind mate connector configured to mate with a corresponding second blind mate connector within the interior portion of the housing, the gimbaling electrical connector being on a side of the fan module opposite a side of the fan module closest to the access opening when the gimbaling electrical connector is electrically connected, wherein the fan module is held in place by the access door contacting and frictionally coupling the fan module when the access door is in the closed position such that when the access door is removed the fan module is no longer frictionally coupled to and held in place by the access door, thereby allowing tool-less and quick placement and removal of the fan module to/from the computer.

2. The computer as recited in claim 1 wherein the fan module is secured within the computer without using fasteners.

3. The computer as recited in claim 1 wherein the fan module comprises:
   a fan carrier and one or more fans mounted to the fan carrier, the fan carrier and one or more fans being installed and removed from the computer as a unit.

4. The computer as recited in claim 3 wherein the fan carrier comprises:
   a mounting member for receiving the one or more fans, the mounting member having an opening for each fan;
   an upper member positioned above the mounting member;
   a lower member positioned below the mounting member;
   a partition disposed between the openings in the mounting member; and a handle for inserting and extracting the fan carrier from the computer.

5. The computer as recited in claim 1 wherein the housing has a cavity for receiving the fan module, the cavity including a first connector therein, and wherein the fan module includes a second connector that engages the first connector when the fan module is inserted into the cavity and that disengages the first connector when removed from the cavity.

6. The computer as recited in claim 1 wherein the housing has a cavity for receiving the fan module, the cavity including a first mounting portion, and wherein the fan module includes a second mounting portion that engages the first mounting portion when the fan module is inserted into the cavity and that disengages the first mounting portion when removed from the cavity.

7. The computer as recited in claim 6 wherein the first mounting portion is a slot, and wherein the second mounting portion is a T-flange.

8. A device for cooling a computer that includes a housing having an interior portion, comprising:
   a quick release removable fan module that slides in and out of the interior portion of the housing, the fan module making tool-less electrical and mechanical connections with the computer when the fan module is slid into the housing, the fan module making tool-less electrical and mechanical disconnections with the computer when the fan module is slid out of the housing, wherein at least one of the electrical connections is made by a gimbaling electrical connector configured to float relative to a structure to which it is mounted, wherein the fan module includes a T-flange configured to slide along a length of a slot within a shelf within the housing as the fan module is slid into the housing, and wherein a bottom portion of the T-flange includes a central member dimensioned for sliding receipt within the slot and a top member dimensioned to slide along a top surface of rests on and is supported by the shelf such that the fan module is suspended from the shelf when the fan module is inside the housing, wherein the slot has an open end at which the T-flange is inserted into the slot, wherein the fan module is held in place by a quick release access door contacting and frictionally coupling the fan module when the access door is in the closed position such that when the access door is removed the fan module is no longer frictionally coupled to and held in place by the access door, the quick release access door being configured to be tool-lessly placed in and removed from the access opening thereby allowing tool-less and quick placement and removal of the fan module to/from the computer.

9. The device as recited in claim 8 wherein the fan module is secured within the computer without using fasteners.

10. The device as recited in claim 8 wherein the fan module comprises:
   a fan carrier and one or more fans mounted to the fan carrier, the fan carrier and one or more fans being installed and removed from the computer as a unit.

11. The device as recited in claim 10 wherein the fan carrier comprises:
   a mounting member for receiving the one or more fans, the mounting member having an opening for each fan;
   an upper member positioned above the mounting member;
   a lower member positioned below the mounting member;
   a partition disposed between the openings in the mounting member; and
   a handle for inserting and extracting the fan carrier from the computer.

12. The device as recited in claim 8 wherein the housing has a cavity for receiving the fan module, the cavity including a first connector therein, and wherein the fan module includes a second connector that engages the first connector when the fan module is inserted into the cavity and that disengages the first connector when removed from the cavity.

13. The computer as recited in claim 1, wherein the gimbaling connector allows multiple degrees of freedom.

14. The computer as recited in claim 1, wherein the gimbaling connector allows a single degree of freedom.

15. The computer as recited in claim 1, wherein the gimbaling connector is one of the following: a pivot joint, a translating joint, a flexure joint, a rotational joint, and a ball and socket joint.

16. The device as recited in claim 8, wherein the gimbaling connector allows multiple degrees of freedom.

17. The device as recited in claim 8, wherein the gimbaling connector allows a single degree of freedom.

18. The device as recited in claim 8, wherein the gimbaling connector is one of the following: a pivot joint, a translating joint, a flexure joint, a rotational joint, and a ball and socket joint.

19. A device for cooling a computer that includes a housing with a channel in its interior portion, the channel having a first electrical connector and configured to receive a fan module, wherein the first electrical connector is positioned inside the channel the device comprising:
   a quick release removable fan module configured to slide in and out of the channel in the interior portion, the fan module having a T-flange configured to slide along a slot within a shelf, wherein the slot has an open end at which the T-flange is inserted into the slot, wherein the T-flange includes a central member dimensioned for sliding within the slot and a top member having and a bottom portion that slides along a top surface of the T flange rests on and is supported by the shelf such that a top member and shelf interface sets a z-axis position of the fan module and a central member and slot interface sets x-axis and y-axis positions of the fan module when the fan module is inside the housing, the fan module making electrical and mechanical connections with the computer when the fan module is slid into the channel, the fan module making tool-less electrical and mechanical disconnections with the computer when the fan module is slid out of the channel, wherein at least one of the electrical connections is made by a second electrical connector on the fan module mating with the first electrical connector inside the channel when the fan module is fully inserted within the channel, wherein the fan module is held in place by a quick release access door contacting and frictionally coupling the fan module when the access door is in the closed position such that when the access door is removed the fan module is no longer frictionally coupled to and held in place by the access door, the quick release access door being configured to be tool-lessly placed in and removed from the access opening thereby allowing tool-less and quick placement and removal of the fan module to/from the computer.

20. The device of claim 19, wherein the fan module further includes a member on the top side of the fan module, the member being dimensioned for slidable receipt by a slot within a top plate of the channel such that the member rests on the shelf when the fan module is fully inserted within the channel.

21. The device of claim 19, wherein the fan module further includes a member configured to mate with a corresponding mating member on a bottom plate of the channel.

22. The device of claim 19, wherein the first connector is adjacent a motherboard inside the housing.

23. The device of claim 8, wherein the divider and walls of the fan module and housing form walls of the first and second channels for directing air to the first and second heat sinks.

* * * * *